United States Patent
Wanlass

(10) Patent No.: US 8,067,687 B2
(45) Date of Patent: Nov. 29, 2011

(54) HIGH-EFFICIENCY, MONOLITHIC, MULTI-BANDGAP, TANDEM PHOTOVOLTAIC ENERGY CONVERTERS

(75) Inventor: Mark W. Wanlass, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 1580 days.

(21) Appl. No.: 11/027,156

(22) Filed: Dec. 30, 2004

(65) Prior Publication Data

US 2006/0144435 A1 Jul. 6, 2006

Related U.S. Application Data

(63) Continuation-in-part of application No. 10/515,243, filed as application No. PCT/US02/16101 on May 21, 2002.

(51) Int. Cl.
H01L 31/00 (2006.01)
H01L 31/042 (2006.01)
H01L 21/302 (2006.01)

(52) U.S. Cl. ........ 136/249; 136/255; 136/256; 136/261; 136/262; 438/37; 438/57; 438/93; 438/98; 438/705; 438/718; 438/745; 438/752; 438/753; 257/53; 257/184; 257/190; 257/191; 257/200; 257/201

(58) Field of Classification Search .......... 136/249, 136/255, 256, 261, 262; 438/37, 57, 93, 438/98, 705, 718, 745, 752, 753; 257/53, 257/184, 190, 191, 200, 201
See application file for complete search history.

(56) References Cited

U.S. PATENT DOCUMENTS

| | | | |
|---|---|---|---|
| 4,214,916 A | 7/1980 | Felsher et al. | |
| 4,255,211 A | 3/1981 | Fraas | |
| 4,278,474 A | 7/1981 | Blakeslee et al. | |
| 4,338,480 A | 7/1982 | Antypas et al. | |
| 4,881,979 A * | 11/1989 | Lewis | 136/249 |
| 4,963,508 A | 10/1990 | Umeno et al. | |
| 4,963,949 A | 10/1990 | Wanlass et al. | |
| 5,019,177 A | 5/1991 | Wanlass | |

(Continued)

FOREIGN PATENT DOCUMENTS

| WO | 03/100868 | 12/2003 |
|---|---|---|
| WO | 2004/017425 | 2/2004 |
| WO | 2004/022820 | 3/2004 |

OTHER PUBLICATIONS

R. Venkatasubramanian et al., "An Inverted-Growth Approach to Development of an IR-Transparent, High-Efficiency AlGaAs/GaAs Cascade Solar Cell", Conf. Record of the 22nd IEEE Photovoltaic Specialists Conference, 1991, pp. 93-98.*

(Continued)

Primary Examiner — Alexa Neckel
Assistant Examiner — Golam Mowla
(74) Attorney, Agent, or Firm — Paul J. White; Cynthia S. Mitchell; W. LaNelle Owens

(57) ABSTRACT

A monolithic, multi-bandgap, tandem solar photovoltaic converter has at least one, and preferably at least two, subcells grown lattice-matched on a substrate with a bandgap in medium to high energy portions of the solar spectrum and at least one subcell grown lattice-mismatched to the substrate with a bandgap in the low energy portion of the solar spectrum, for example, about 1 eV.

59 Claims, 8 Drawing Sheets

U.S. PATENT DOCUMENTS

| | | |
|---|---|---|
| 5,053,083 A | 10/1991 | Sinton |
| 5,322,572 A | 6/1994 | Wanlass |
| 5,376,185 A | 12/1994 | Wanlass |
| 5,407,491 A | 4/1995 | Freundlich et al. |
| 5,479,032 A * | 12/1995 | Forrest et al. ............... 257/190 |
| 5,571,339 A | 11/1996 | Ringel et al. |
| 5,716,459 A | 2/1998 | Chang et al. |
| 5,853,497 A | 12/1998 | Lillington et al. |
| 5,865,906 A | 2/1999 | Ferguson et al. |
| 5,944,913 A | 8/1999 | Hou et al. |
| 6,034,321 A | 3/2000 | Jenkins |
| 6,107,562 A | 8/2000 | Hashimoto et al. |
| 6,150,604 A | 11/2000 | Freundlich et al. |
| 6,162,987 A | 12/2000 | Murray et al. |
| 6,180,432 B1 * | 1/2001 | Freeouf ............... 438/93 |
| 6,218,607 B1 | 4/2001 | Mulligan et al. |
| 6,239,354 B1 | 5/2001 | Wanlass |
| 6,252,287 B1 | 6/2001 | Kurtz et al. |
| 6,255,580 B1 | 7/2001 | Karam et al. |
| 6,265,653 B1 | 7/2001 | Haigh et al. |
| 6,281,426 B1 | 8/2001 | Olson et al. |
| 6,300,557 B1 | 10/2001 | Wanlass |
| 6,300,558 B1 | 10/2001 | Takamoto et al. |
| 6,316,715 B1 | 11/2001 | King et al. |
| 6,340,788 B1 | 1/2002 | King et al. |
| 6,482,672 B1 | 11/2002 | Hoffman et al. |
| 6,660,928 B1 | 12/2003 | Patton et al. |
| 6,680,432 B2 | 1/2004 | Sharps et al. |
| 6,815,736 B2 | 11/2004 | Mascarenhas |
| 6,951,819 B2 | 10/2005 | Iles et al. |
| 7,095,050 B2 | 8/2006 | Wanlass et al. |
| 7,488,890 B2 | 2/2009 | Takamoto et al. |
| 2006/0162768 A1 | 7/2006 | Wanlass et al. |
| 2009/0229659 A1 | 9/2009 | Wanlass et al. |

OTHER PUBLICATIONS

Sinharoy, S. et al., "Progress in the Development of Metamorphic Multi-junction III-V Space Solar Cells," Prog. Photovolt: Res. Appl. vol. 10, 2002, pp. 427-432.

Aiken, "Anti-reflection coating design for series interconnected multi-junction solar cells", Progress Photovoltaics: Research Applications, 2000, vol. 8 pp. 563-570.

Aiken, "High performance anti-reflection coatings for broadband multi-junction solar cells," Solar Energy Materials & Solar Cells, 2000, vol. 64, pp. 393-404.

Lamorte, et al., "Computer Modeling of a Two-junction, Monolithic Cascade Solar Cell," IEEE Transactions on Electron Devices, Jan. 1980, vol. 27, Issue 1, pp. 231-249.

Wanlass, et al., "A Rigorous Analysis of Series-Connected, Multi-Bandgap, Tandem Thermophotovoltaic (TPV) Energy Converters," Proc. Sixth Conference on Thermophotovoltaic Generation of Electricity (TPV6), 2004, pp. 462-470.

Wanlass, et al., "Lattice-Mismatched Approaches for High Performance, III-V Photovoltaic Energy Converters", 31st IEEE Photovoltaics Specialists Conference and Exhibition, Feb. 2005, pp. 1-6.

Wehrer, et al., "0.74/0.55-eV GaxIn1-xAs/InAsyP1-y Monolithic, Tandem, MIM TPV Converters: Design, Growth, Processing and Performance," Proc. 29th IEEE Photovoltaic Spec. Conf., May 2002, pp. 884-887, New Orleans, LA.

Yablonovich, et al., "Extreme selectivity in the lift-off of epitaxial GaAs films", Applied Physics Letters, Dec. 28, 1987, vol. 51, No. 26, pp. 2222-2224.

Zahler, et al., "Wafer Bonding and Layer Transfer Processes for 4-Junction High Efficiency Solar Cells", Proceedings of the 29th IEEE Photovoltaic Specialists Conference, May 2002, pp. 1039-1042 New Orleans, LA.

Official Action for U.S. Appl. No. 10/515,243, mailed Mar. 4, 2010.
Official Action for U.S. Appl. No. 10/515,243, mailed Jun. 18, 2009.
International Search Report for International (PCT) Application No. PCT/US02/16101, mailed Sep. 6, 2002.
Written Opinion for for International (PCT) Application No. PCT/US02/16101, mailed Apr. 6, 2004.
International Preliminary Examination Report for International (PCT) Appliction No. PCT/US02/16101, mailed Aug. 30, 2004.

* cited by examiner

HIGH-EFFICIENCY, MONOLITHIC, MULTI-BANDGAP, TANDEM PHOTOVOLTAIC ENERGY CONVERTERS

CROSS-REFERENCE TO RELATED APPLICATIONS

This application is a continuation-in-part of U.S. patent application Ser. No. 10/515,243, entitled "Low-Bandgap, Monolithic, Multi-Bandgap, Optoelectronic Devices", filed on Nov. 19, 2004, which is the national stage of PCT application no. PCT/US02/16101 filed on May 21, 2002, and is incorporated herein by reference for all that it discloses.

CONTRACTUAL ORIGIN OF THE INVENTION

The United States Government has rights in this invention under Contract No. DE-AC36-99GO10337 between the United States Department of Energy and the National Renewable Energy Laboratory, a Division of the Midwest Research Institute.

TECHNICAL FIELD

This invention is related to photovoltaic devices and, more specifically, to monolithic, multi-bandgap, tandem photovoltaic solar energy converters.

BACKGROUND OF THE INVENTION

It is well-known that the most efficient conversion of solar energy to electrical energy with the least thermalization loss in semiconductor materials is accomplished by matching the photon energy of the incident solar radiation to the amount of energy needed to excite electrons in the semiconductor material to transcend the bandgap from the valence band to the conduction band. However, since solar radiation usually comprises a wide range of wavelengths, use of only one semiconductor material with one bandgap to absorb such radiant energy and convert it to electrical energy will result in large inefficiencies and energy losses to unwanted heat.

Ideally, there would be a semiconductor material with a bandgap to match the photon energy for every wavelength in the radiation. That kind of device is impractical, if not impossible, but persons skilled in the art are building monolithic stacks of different semiconductor materials into devices commonly called tandem converters and/or monolithic, multi-bandgap or multi-bandgap converters, to get two, three, four, or more discrete bandgaps spread across the solar spectrum to match more closely to several different wavelengths of radiation and, thereby, achieve more efficient conversion of radiant energy to electrical energy. Essentially, the radiation is directed first into a high bandgap semiconductor material, which absorbs the shorter wavelength, higher energy portions of the incident radiation and which is substantially transparent to longer wavelength, lower energy portions of the incident radiation. Therefore, the higher energy portions of the radiant energy are converted to electric energy by the higher bandgap semiconductor materials without excessive thermalization and loss of energy in the form of heat, while the longer wavelength, lower energy portions of the radiation are transmitted to one or more subsequent semiconductor materials with smaller bandgaps for further selective absorption and conversion of remaining radiation to electrical energy.

Semiconductor compounds and alloys with bandgaps in the various desired energy ranges are known, but that knowledge alone does not solve the problem of making an efficient and useful energy conversion device. Defects in crystalline semiconductor materials, such as impurities, dislocations, and fractures provide unwanted recombination sites for photo-generated electron-hole pairs, resulting in decreased energy conversion efficiency. Therefore, high-performance, photovoltaic conversion cells comprising semiconductor materials with the desired bandgaps, often require high quality, epitaxially grown crystals with few, if any, defects. Growing the various structural layers of semiconductor materials required for a multi-bandgap, tandem, photovoltaic (PV) conversion device in a monolithic form is the most elegant, and possibly the most cost-effective approach.

Epitaxial crystal growth of the various compound or alloy semiconductor layers with desired bandgaps is most successful, when all of the materials are lattice-matched (LM), so that semiconductor materials with larger crystal lattice constants are not interfaced with other materials that have smaller lattice constants or vice versa. Lattice-mismatching (LMM) in adjacent crystal materials causes lattice strain, which, when high enough, is usually manifested in dislocations, fractures, wafer bowing, and other problems that degrade or destroy electrical characteristics and capabilities of the device. Unfortunately, the semiconductor materials that have the desired bandgaps for absorption and conversion of radiant energy in some energy or wavelength bands do not always lattice match other semiconductor materials with other desired bandgaps for absorption and conversion of radiant energy in other energy or wavelength bands.

Co-pending U.S. patent application, Ser. No. 10/515,243, addressed this problem for low bandgap (e.g., less than 1.35 eV), monolithic, multi-bandgap devices in order to convert lower energy, infrared radiation (e.g., 918 to 3483 nm) to electricity more efficiently. By the use of combination of cells lattice-matched (LM) to InP substrates, lattice constant transition layers and lattice-mismatched (LMM) cells, inverted monofacial and bifacial monolithic structures, ultra-thin monolithic, multi-band-gap, tandem structures, and other features, the inventions in that co-pending patent application could provide monolithic, multi-band-gap, tandem cells with band gaps in various combinations ranging from about 1.35 eV down to as low as about 0.36 eV. That range comprises invisible infrared light. There are also well-developed medium and high band gap, lattice-matched semiconductors grown on GaAs or Ge substrates, such as GaAs, GaInAsP, AlGaAs, GaInP, and AlGaInP. It was suggested in the co-pending U.S. patent application, Ser No. 10/515,243, that the low-bandgap, monolithic, multi-band-gap, tandem converters disclosed therein could be joined mechanically to higher band gap cell structures. However, prior to this invention, monolithic, multi-band-gap, tandem (MMT) solar photovoltaic (SPV) converters with lattice-matched subcells in the medium to high bandgap ranges have not included any subcells in the lower band gap ranges, such as lower than about 1.4 eV, with the exception of designs that incorporate lattice-matched Ge subcells. Therefore, prior to this invention, ultra-high-efficiency, monolithic, multi-band-gap, tandem, solar photovoltaic (SPV) converters have not been demonstrated due to the lack of a suitable, high-performance, optimum, low-band-gap subcell option to combine with the medium to high bandgap subcells in such structures.

SUMMARY OF THE INVENTION

Accordingly, an object of this invention is to provide a high-efficiency, monolithic, multi-bandgap, tandem solar photovoltaic converter that includes at least one cell with a bandgap less than 1.4 eV along with at least one bandgap more than 1.4 eV.

Another object of this invention is to provide high-efficiency, multi-bandgap, tandem solar photovoltaic converters that can be grown epitaxially on GaAs, Ge, or $Si_xGe_{1-x}$, virtual, or bulk substrates (monocrystalline or polycrystalline) or on appropriate compliant or engineered substrates.

Still another object of the invention is to provide a method of fabricating ultra-thin, monolithic, multi-bandgap, tandem, solar photovoltaic converters that can be mounted on a variety of handles for various advantages or enhancements, including, but not limited to, heat sinks for better thermal management, high specific power (w/kg) for space applications, strong flexible handles for flexible solar photovoltaic converters, and making it possible to reclaim scarce and expensive substrate materials.

Yet another object of the invention is to provide a high-efficiency, monolithic, multi-bandgap, tandem, solar photovoltaic converter wherein defects in lattice-mismatched (LMM), lower bandgap, cells are blocked from extending into lattice-matched (LM), higher bandgap, cells by a bifacial substrate on which the LMM and LM cells are grown epitaxially.

Additional objects, advantages, and novel features of the invention are set forth in part in the description that follows and will become apparent to those skilled in the art upon examination of the following description and figures or may be learned by practicing the invention. Further, the objects and the advantages of the invention may be realized and attained by means of the instrumentalities and in combinations particularly pointed out in the appended claims.

To achieve the foregoing and other objects and in accordance with the purposes of the present invention, as embodied and broadly described herein, at least one, and preferably more than one, subcells are grown epitaxially lattice-matched to a substrate with the bandgap(s) of the subcell(s) in the medium or high energy portions of the solar spectrum, and, further, wherein at least one substrate is grown lattice-mismatched on a compositionally graded layer to have a bandgap in the low energy portion of the solar spectrum. This invention enables a monolithic, multi-bandgap, tandem solar photovoltaic converter to have at least one subcell in the low energy portion of the solar spectrum along with one or more subcell(s) with bandgap(s) in the medium and/or high energy portions of the solar spectrum. Preferably, the substrate chosen accommodates growth of these subcells with only one graded layer, although one or more additional graded layer(s) can be used to accommodate one or more additional subcell(s) with bandgap(s) that are even lower.

Since lattice-matched subcells are less likely to have defects than lattice-mismatched subcells, and since most of the power is generated by the subcells with bandgaps in the medium and high portions of the solar spectrum, it is preferred that the subcells with bandgaps in the medium and high portions of the solar spectrum be lattice-matched. Also, the substrate can be removed to leave an ultra-thin, monolithic, multi-bandgap, tandem solar photovoltaic converter, which, when mounted on an appropriate handle, can provide superior thermal management, flexibility, particular usefulness and adaptability for monolithic, integrated module (MIM) applications, and the like.

Bifacial versions can further isolate the lattice-matched subcells from the lattice-mismatched subcells and thereby avoid defects in the lattice-mismatched layers from looping back into the lattice-matched layers. Therefore, in bifacial structures, it is preferred to grow the lattice-matched subcells on one face of the substrate and to grow the graded layer(s) and lattice-mismatched layer(s) on the opposite face.

BRIEF DESCRIPTION OF THE DRAWINGS

The accompanying drawings, which are incorporated in and form a part; of the specification, illustrate the preferred embodiments of the present invention, and together with the descriptions serve to explain the principles of the invention.

In the drawings.

DETAILED DESCRIPTION OF PREFERRED EMBODIMENTS

Figure 1:
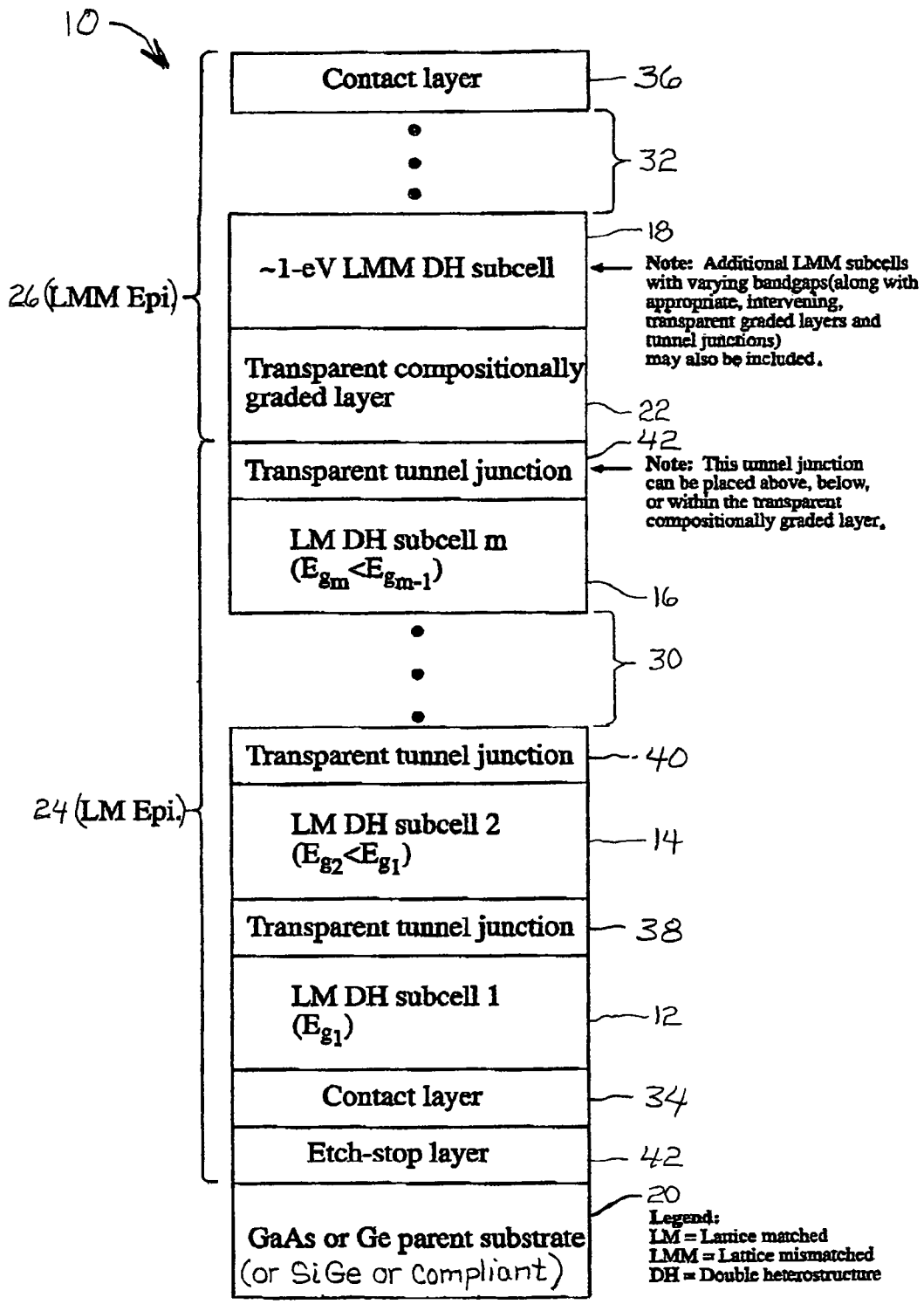
FIG. 1 is a diagrammatic view of a generic example of an inverted, monoloithic, multi-bandgap, tandem, solar photovoltaic converter of this invention.

The example inverted, monolithic, multi-bandgap, tandem (MMT) solar photovoltaic converter 10 shown in FIG. 1 is a generic representation illustrating at least one lattice-matched (LM) subcell 12 (LM DH subcell 1) grown epitaxially on a parent substrate 20 and at least one lattice-mismatched (LMM) subcell 18 (LMM DH subcell) with at least one transparent compositionally graded layer 22 interposed between the lattice-matched and the lattice-mismatched subcells. The brackets 24, 26 indicate the lattice-matched epilayers (LM Epi.) and the lattice-mismatched epilayers (LMM Epi.), respectively. The second lattice-matched subcell 14 (LM DH subcell 2) in the lattice-matched epilayers 24 is optional, as is the lattice-matched subcell 16 (LM DH subcell m) and any number of additional intervening lattice-matched subcells indicated schematically by the three dots and bracket 30 in the lattice-matched epilayers 24. Likewise, the three dots and bracket 32 between the lattice-mismatched subcell 18 and the contact layer 36 indicate optional additional lattice-mismatched (LMM) subcells with intervening transparent tunnel junction layers (not shown) that can be included, if desired.

The following Tables I through V summarize several specific example (not exclusive) subcell materials for monolithic, multi-bandgap, tandem (MMT) solar photovoltaic (SPV) converter structures with two subcells, three subcells, four subcells, five subcells, and six subcells, respectively.

TABLE I

Two Subcells

| Subcell | Absorber Material/~$E_g$(eV) | PCC Material | Comments |
|---|---|---|---|
| Example 1 | | | |
| 1 | LM $Ga_xIn_{1-x}As_yP_{1-y}$/1.7 | $Al_zGa_xIn_{1-x-z}As_yP_{1-y}$ | None |
| 2 | LMM $Ga_xIn_{1-x}As$/1.1 | $Al_zGa_xIn_{1-x-z}As_yP_{1-y}$ | |
| Example 2 | | | |
| 1 | LM $Al_zGa_{1-z}As$/1.7 | $Al_zGa_xIn_{1-x-z}As_yP_{1-y}$ | None |
| 2 | LMM $Ga_xIn_{1-x}As$/1.1 | $Al_zGa_xIn_{1-x-z}As_yP_{1-y}$ | |
| Example 3 | | | |
| 1 | LM $Ga_xIn_{1-x}P$/1.8 | $Al_zGa_xIn_{1-x-z}As_yP_{1-y}$ | None |
| 2 | LMM $Ga_xIn_{1-x}As$/1.2 | $Al_zGa_xIn_{1-x-z}As_yP_{1-y}$ | |

TABLE II

Three Subcells

| Subcell | Absorber Material/~$E_g$(eV) | PCC Material | Comments |
|---|---|---|---|
| Example 1 | | | |
| 1 | LM $(Al)Ga_xIn_{1-x}P$/1.9 | $Al_zGa_xIn_{1-x-z}As_yP_{1-y}$ | Indium may be added |
| 2 | LM $(In)GaAs$/1.4 | $Al_zGa_xIn_{1-x-z}As_yP_{1-y}$ | to subcell 2 to LM to |
| 3 | LMM $Ga_xIn_{1-x}As$/1.0 | $Al_zGa_xIn_{1-x-z}As_yP_{1-y}$ | Ge substrate. |
| Example 2 | | | |
| 1 | LM $Al_zGa_{1-z}As$/1.9 | $Al_zGa_xIn_{1-x-z}As_yP_{1-y}$ | Indium may be added |
| 2 | LM $(In)GaAs$/1.4 | $Al_zGa_xIn_{1-x-z}As_yP_{1-y}$ | to subcell 2 to LM to |
| 3 | LMM $Ga_xIn_{1-x}As$/1.0 | $Al_zGa_xIn_{1-x-z}As_yP_{1-y}$ | Ge substrate. |

TABLE III

Four Subcells

| Subcell | Absorber Material/~$E_g$(eV) | PCC Material | Comments |
|---|---|---|---|
| Example 1 | | | |
| 1 | LM $(Al)Ga_xIn_{1-x}P$/1.9 | $Al_zGa_xIn_{1-x-z}As_yP_{1-y}$ | Subcell 1 is very thin. |
| 2 | LM $(Al)Ga_xIn_{1-x}As_yP_{1-y}$/1.7 | $Al_zGa_xIn_{1-x-z}As_yP_{1-y}$ | Indium may be added |
| 3 | LM $(In)GaAs$/1.4 | $Al_zGa_xIn_{1-x-z}As_yP_{1-y}$ | to subcell 3 to LM |
| 4 | LMM $Ga_xIn_{1-x}As$/1.1 | $Al_zGa_xIn_{1-x-z}As_yP_{1-y}$ | to Ge. |
| Example 2 | | | |
| 1 | LM $(Al)Ga_xIn_{1-x}P$/1.9 | $Al_zGa_xIn_{1-x-z}As_yP_{1-y}$ | Subcell 1 is very thin. |
| 2 | LM $Al_zGa_{1-z}As$/1.7 | $Al_zGa_xIn_{1-x-z}As_yP_{1-y}$ | Indium may be added |
| 3 | LM $(In)GaAs$/1.4 | $Al_zGa_xIn_{1-x-z}As_yP_{1-y}$ | to subcell 3 to LM |
| 4 | LMM $Ga_xIn_{1-x}As$/1.1 | $Al_zGa_xIn_{1-x-z}As_yP_{1-y}$ | to Ge. |

TABLE IV

Five Subcells

| Subcell | Absorber Material/~$E_g$(eV) | PCC Material | Comments |
|---|---|---|---|
| Example 1 | | | |
| 1 | LM $(Al)Ga_xIn_{1-x}P$/1.9 | $Al_zGa_xIn_{1-x-z}As_yP_{1-y}$ | Subcells 1 & 2 are iso-$E_g$ to |
| 2 | LM $(Al)Ga_xIn_{1-x}P$/1.9 | $Al_zGa_xIn_{1-x-z}As_yP_{1-y}$ | affect photocurrent split. |
| 3 | LM $(Al)Ga_xIn_{1-x}As_yP_{1-y}$/1.7 | $Al_zGa_xIn_{1-x-z}As_yP_{1-y}$ | Indium may be added to |
| 4 | LM $(In)GaAs$/1.4 | $Al_zGa_xIn_{1-x-z}As_yP_{1-y}$ | subcell 4 to LM to Ge. |
| 5 | LMM $Ga_xIn_{1-x}As$/1.1 | $Al_zGa_xIn_{1-x-z}As_yP_{1-y}$ | |
| Example 2 | | | |
| 1 | LM $(Al)Ga_xIn_{1-x}P$/1.9 | $Al_zGa_xIn_{1-x-z}As_yP_{1-y}$ | Subcells 1 & 2 are iso-$E_g$ to |
| 2 | LM $(Al)Ga_xIn_{1-x}P$/1.9 | $Al_zGa_xIn_{1-x-z}As_yP_{1-y}$ | affect photocurrent split. |
| 3 | LM $Al_zGa_{1-z}As$/1.7 | $Al_zGa_xIn_{1-x-z}As_yP_{1-y}$ | Indium may be added to |

TABLE IV-continued

Five Subcells

| Subcell | Absorber Material/~$E_g$(eV) | PCC Material | Comments |
|---|---|---|---|
| 4 | LM (In)GaAs/1.4 | $Al_zGa_xIn_{1-x-z}As_yP_{1-y}$ | subcell 4 to LM to Ge. |
| 5 | LMM $Ga_xIn_{1-x}As$/1.1 | $Al_zGa_xIn_{1-x-z}As_yP_{1-y}$ | |

TABLE V

Six Subcells

| Subcell | Absorber Material/~$E_g$(eV) | PCC Material | Comments |
|---|---|---|---|
| | | Example 1 | |
| 1 | LM $(Al)Ga_xIn_{1-x}P$/1.9 | $Al_zGa_xIn_{1-x-z}As_yP_{1-y}$ | Subcells 1 & 2 are iso-$E_g$ to |
| 2 | LM $(Al)Ga_xIn_{1-x}P$/1.9 | $Al_zGa_xIn_{1-x-z}As_yP_{1-y}$ | affect photocurrent split. |
| 3 | LM $(Al)Ga_xIn_{1-x}As_yP_{1-y}$/1.7 | $Al_zGa_xIn_{1-x-z}As_yP_{1-y}$ | Indium may be added to |
| 4 | LM (In)GaAs/1.4 | $Al_zGa_xIn_{1-x-z}As_yP_{1-y}$ | subcell 4 to LM to Ge. |
| 5 | LMM $Ga_xIn_{1-x}As(P)$/1.1 | $Al_zGa_xIn_{1-x-z}As_yP_{1-y}$ | Single or dual GL to |
| 6 | LMM $Ga_xIn_{1-x}As$/0.9 | $Al_zGa_xIn_{1-x-z}As_yP_{1-y}$ | incorporate subcells 5 & 6. |
| | | Example 2 | |
| 1 | LM $(Al)Ga_xIn_{1-x}P$/1.9 | $Al_zGa_xIn_{1-x-z}As_yP_{1-y}$ | Subcells 1 & 2 are iso-$E_g$ to |
| 2 | LM $(Al)Ga_xIn_{1-x}P$/1.9 | $Al_zGa_xIn_{1-x-z}As_yP_{1-y}$ | affect photocurrent split. |
| 3 | LM $Al_zGa_{1-z}As$/1.7 | $Al_zGa_xIn_{1-x-z}As_yP_{1-y}$ | Indium may be added to |
| 4 | LM (In)GaAs/1.4 | $Al_zGa_xIn_{1-x-z}As_yP_{1-y}$ | subcell 4 to LM to Ge. |
| 5 | LMM $Ga_xIn_{1-x}As(P)$/1.1 | $Al_zGa_xIn_{1-x-z}As_yP_{1-y}$ | Single or dual GL to |
| 6 | LMM $Ga_xIn_{1-x}As$/0.9 | $Al_zGa_xIn_{1-x-z}As_yP_{1-y}$ | incorporate subcells 5 & 6. |

Table I illustrates three examples of two subcell MMT SPV converter, which is the simplest structure of the invention, i.e., one lattice-matched (LM) subcell 12 and one lattice-mismatched (LMM) subcell 18 as shown in FIG. 1. Each of the three examples includes the parent substrate 20, a front contact layer 34, a transparent tunnel junction 42, a transparent compositionally graded layer 22, and a back contact layer 36. The second subcell 14, third subcell 16, and transparent tunnel junctions 38, 40 in the generic example of FIG. 1 would not be included in the species examples 1, 2, and 3 in Table I. The etch stop layer 43 in FIG. 1 is optional, but it is recommended for situations in which the MMT SPV structure 10 will be converted into an ultra-thin MMT SPV structure by inverting and mounting it on a handle (not shown in FIG. 1) and removing the substrate 20, such as by etching, as will be explained in more detail below.

As shown in Example 1 in Table I, the first subcell 12 in FIG. 1, which is lattice-matched (LM) to the GaAs or Ge parent substrate 20, can be $Ga_xIn_{1-x}As_yP_{1-y}$ with a bandgap of 1.7 eV. For example, $Ga_xIn_{1-x}As_yP_{1-y}$, where x=0.68 and y=0.34, has a bandgap of 1.7 eV. The second subcell 22 in Example 1 in Table I and shown in FIG. 1, which is lattice-mismatched (LMM) to the substrate 20 in order to have a bandgap less than 1.4 eV, e.g. about 1.1 eV, can be $Ga_xIn_{1-x}As$. For example, $Ga_xIn_{1-x}As$, where x=0.80, has a bandgap of 1.1 eV. Therefore, when solar radiation is incident first on the first subcell 12 with its bandgap of 1.7 eV, the higher energy radiation, i.e., the shorter wavelength radiation of 729 nanometers (nm) or shorter, will be absorbed by the first subcell 12 and converted to electricity, while the radiation having wavelengths longer than 729 nm will pass through the first subcell 12 and propagate through the MMT structure 10 to the second subcell in the Example 1 of Table I, i.e., to the lattice-mismatched (LMM) subcell 18 in FIG. 1. Again, this Example 1 of Table I has only one LM subcell 12 and one LMM subcell 18, so the subcells 14, 16 in FIG. 1 do not exist for this Example 1. However, it is clear that the tunnel junction 42 and the compositionally graded layer 22 have to be transparent to the solar radiation with wavelengths longer than 729 nm so they do not absorb that lower energy radiation before it reaches the second subcell 18, where it can be converted to electricity. Any solar radiation absorbed by the tunnel junction 42 or by the compositionally graded layer 22 would be thermalized and lost as heat. Therefore, to avoid that result, the compositionally graded layer 22 must have a bandgap at least as high as the 1.7 eV bandgap of the first subcell 12. Because the tunnel junction is very thin, its bandgap can be slightly lower than that of the first subcell 12.

Figure 2:
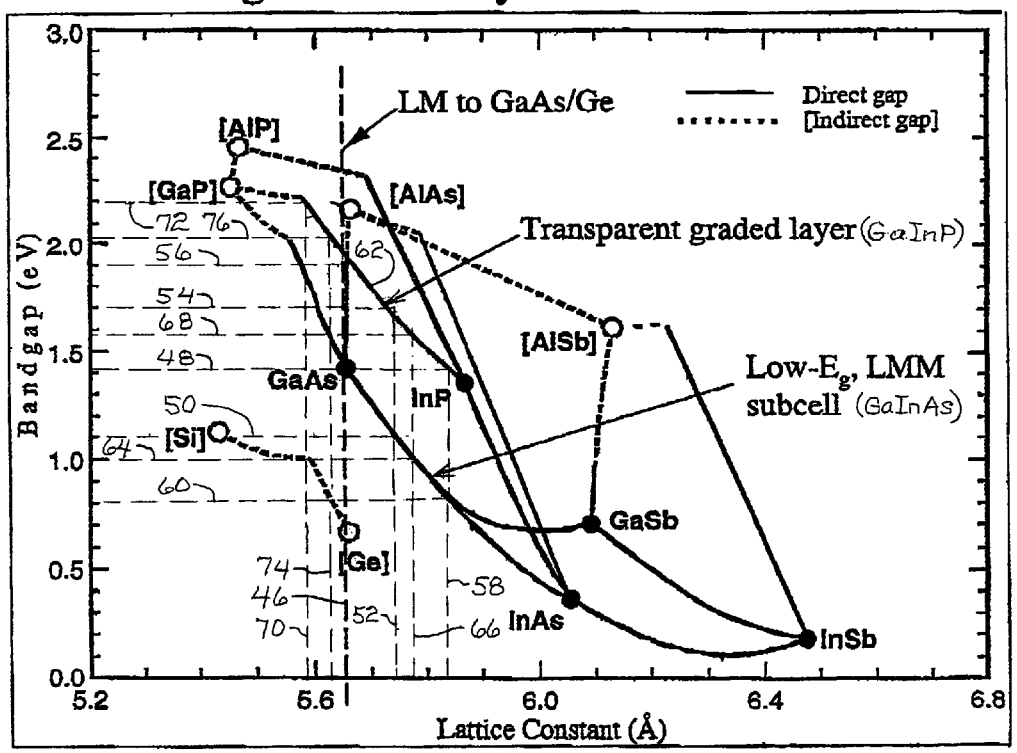
FIG. 2 is a bandgap versus lattice constant chart showing room temperature bandgap as a function of lattice constant for semiconductor Group III-V alloys used in this invention and for silicon, germanium $Si_xGe_{1-x}$ alloys.

As shown in FIG. 2, the lattice constant of the GaAs substrate, indicated by broken line 46, is 5.65 Å, and the lattice constant of Ge is only slightly more. Therefore, Group III-V alloys, such as the $Ga_xIn_{1-x}As_yP_{1-y}$ of the first subcell 12 in the Example 1 of Table I that have bandgaps higher than the 1.4 eV bandgap of GaAs (broken line 48) can be lattice-matched to the GaAs or Ge parent substrate 20. However, as also shown by FIG. 3, there is no Group III-V alloy with a band gap lower than the 1.4 eV bandgap 48 of GaAs that can be lattice-matched with the GaAs or Ge parent substrate. Therefore, $Ga_xIn_{1-x}As$ second subcell 18 with its bandgap 50 of 1.1 eV in the Example 1 of Table I has a lattice constant of 5.74 Å, as shown by broken line 52 in FIG. 2, which is substantially larger than the 5.65 Å lattice constant of the GaAs substrate 20. Therefore, the compositionally graded layer 22 of either GaInP or AlGaInAsP with a bandgap 54 of at least 1.7 eV to be transparent to the solar radiation that was not absorbed by the first subcell 12 is provided to transition from the 5.65 Å lattice constant 46 of GaAs to the 5.74 Å lattice constant 52 of the 1.1 eV band gap $Ga_xIn_{1-x}As$ of the second subcell 18. Such compositionally graded GaInP can be made by starting with GaInP that is lattice-matched to GaAs and incrementally adding P until the lattice constant 52 of 5.74 Å is reached. If AlGaInAsP is desired, some Al and As can also be added.

As can also be seen in FIG. 2, a III-V alloy with a direct bandgap 56 as high as 1.9 eV can be lattice-matched with the 5.65 Å lattice constant 46 of the GaAs parent substrate 20. Also, a GaInP or AlGaInAsP compositionally graded layer can transition from the 5.65 Å lattice constant 46 of GaAs substrate bandgap 48 of 1.4 Å to GaInP or AlGaInAsP with a bandgap 48 of 1.4 Å and a lattice constant 58 of 5.83 Å, which can accommodate a GaInAs LMM subcell bandgap 60 as low as about 0.8 eV. Therefore, any number of LM subcells with bandgaps between 1.4 eV and 1.9 eV can be used, and any number of LMM subcells with bandgaps as low as 0.8 eV, depending on the LM bandgaps used, can be accommodated with one transparent compositionally graded layer 22. Of course, more than one compositionally graded layer can also be used to reach even lower bandgaps, as explained in co-pending U.S. patent application, Ser. No. 10/515,243.

With the explanation above for the Example 1, two-subcell embodiment from Table I, a person skilled in the art will understand how to describe and utilize the remaining, more complex examples in Tables I-V. Therefore, it is not necessary to describe each of the examples in detail for an understanding of how to make and use this invention. Suffice it to say that a substantial number of device configurations are possible by combining the LM and LMM materials as illustrated by, but not limited to, the examples in Tables I-V.

An operative principle is to select a substrate 20 material that has a lattice constant which matches the lattice constant of a Group III-V alloy that has a direct bandgap which is high enough to serve as the first subcell 12 in the MMT SVP converter 10 structure. In the two-subcell Example 1 described above, the substrate was GaAs, and its 5.65 Å lattice constant line 46 in FIG. 2 extends upwardly in FIG. 2 to intersect the direct bandgap versus lattice constant line 62 of ternary GaInP at about 1.9 eV, as indicated by broken line 56. Therefore, the first subcell 12 in a MMT SVP converter structure 10 built on a GaAs parent substrate 20 can have a bandgap as high as 1.9 eV (or higher if Al is added), which, as shown in the three-subcell Example 1 in Table II, can be provided by $Ga_xIn_{1-x}P$. Specifically, $Ga_xIn_{1-x}P$, where x=0.5, has a bandgap of 1.9 eV, so the first LM subcell 12 in the Example 1 of Table II can be $Ga_xIn_{1-x}P$, where x=0.5. As indicated by the Al in parentheses (Al) for the first subcell in Example 1 of Table II, addition of some aluminum (Al) is an option (parentheses indicates optional elements in the examples in Tables I-V) for slightly raising the bandgap. Al raises the bandgap of Group III-V ternary and quaternary alloys without changing lattice constant if Ga is already a component in the alloy, although Al also efficiently getters trace oxygen and water vapor in the crystal growth system, which can result in defects that degrade device performance.

Continuing with the Table II, Example 1 of a three-subcell structure 10, the second LM subcell 14 is chosen to be GaAs with its 1.4 eV bandgap 48 to lattice-match a GaAs parent substrate 20. The Example 1 in Table II indicates that addition of some In is optional, for example to lattice-match a Ge parent substrate, which has a slightly larger lattice constant than GaAs. Then, for the third subcell corresponding to the LMM subcell 18 in FIG. 1, which is lattice-mismatched (LMM) to the substrate so that it can have a lower bandgap than GaAs, i.e., a 1.0 eV bandgap as indicated by the broken line 64 in FIG. 2, $Ga_xIn_{1-x}As$ is used. Specifically, $Ga_xIn_{1-x}As$, where x=0.75, provides a bandgap 64 of 1.0 eV, but its lattice constant is 5.78 Å as indicated by broken line 66 in FIG. 2. Tracing broken line 66 upwardly to the GaInP bandgap versus lattice constant curve 62 and then tracing curve 62 upwardly and leftwardly to its intersection with the lattice constant line 56 at about 1.9 eV shows that a graded layer of GaInP can be used to transition from the 5.65 Å lattice constant 46 of GaAs to the 5.78 Å lattice constant 66 of the $Ga_xIn_{1-x}P$ needed for the desired 1.0 eV bandgap 64 for the LM subcell 18. Therefore, the GaInP graded layer can be started with a formulation for a 5.65 Å lattice constant 46 and adding incrementally more In until the lattice constant of the GaInP reaches the 5.78 Å lattice constant of the $Ga_xIn_{1-x}As$ with 1.0 eV bandgap, which is designated for the third subcell 18. A final check shows that the 1.6 eV bandgap 68 of the terminal GaInP in the graded layer 22 is still higher than the 1.4 eV bandgap 48 of the (In)GaAs second LM subcell 14, so the graded layer 22 is transparent to any solar radiation that is not absorbed by the second LM subcell 14. Again, the graded layer 22 could comprise AlGaInAsP, which would also be transparent to the solar radiation not absorbed by the second LM subcell 14 while providing the needed lattice constant transition. However, the ternary GaInP is simpler and serves the purpose.

It should be mentioned that, while GaAs and Ge have lattice constants that accommodate epitaxial, lattice-matched growth of Group III-V alloys in bandgaps from about 1.4 eV to about 1.9 eV, this invention is not limited to GaAs or Ge substrates. On the contrary, graded SiGe alloys engineered to have certain useful bandgaps and lattice constants are also available. For example, but not for limitation, a 50-50 alloy of SiGe has a lattice constant of about 5.58 Å, as indicated by broken line 70, which lattice-matches to Group III-V alloys with direct bandgaps from about 1.9 eV to as high as about 2.2 eV, as shown by broken lines 56 and 72 in FIG. 2. Therefore, it is possible to use such engineered SiGe alloy substrates to grow lattice-matched subcells into those higher eV ranges to convert more of the higher energy solar radiation to electricity.

For example, as shown by lines 74, 76 in FIG. 2, a SiGe alloy engineered to have a lattice constant of about 5.62 Å can accommodate lattice-matched subcells with bandgaps as high as about 2.0 eV and as low as about 1.6 eV. That lower LM bandgap limit of about 1.6 eV, as shown by broken line 68, if implemented in a LM subcell, can enable one compositionally graded layer to accommodate a LMM subcell with a bandgap close to 1.0 eV, as indicated by broken lines 64, 66, 68 in FIG. 2.

Other engineered substrates and compliant substrates can also be used instead of GaAs or Ge substrates. For example, an engineered substrate comprising a thin layer of GaAs bonded onto a Si wafer to form an epitaxial template can be fabricated according to a process developed by Professor Harry Atwater, California Institute of Technology. See J. M. Zahler et al., "Wafer Bonding and Layer Transfer Processes for 4-Junction High Efficiency Solar Cells," Proc. $29^{th}$ IEEE PVSC, 5/20-24/02, New Orleans, La. Compliant substrates allows a range of lattice constants to be used by conforming to the material being grown. An example of a compliant substrate is the Si/STO/GaAs technology developed by Motorola. A typical compliant substrate may be made, for example, with inexpensive substrate material, such as silicon, and with an amorphous oxide of the substrate material followed by a layer of perovskite oxide.

The point of this discussion is that the invention does not rely or depend on the use of GaAs, Ge, or any other specific substrate material. Any substrate material is appropriate for this invention if it allows epitaxial growth of at least one, and preferably more than one, lattice-matched (LM) subcell(s) 12, 14, 16 in the high (1.6-2.2 eV) and medium (1.2-1.6 eV) ranges and which accommodates expitaxial growth of at least one lattice-mismatch (LMM) subcell 18 in the low (0.8-1.2 eV) range with only one intervening graded layer 22, which is transparent to solar radiation and is not absorbed by the lowest bandgap LM subcell m that immediately precedes the graded layer 22.

Of course, as mentioned above, additional graded layers to accommodate even lower bandgap LMM subcells, as indicated by the bracket 32 in FIG. 1, can also be added. However, it is preferred that all of the subcells 12, 14, 16, etc., that have bandgaps in the medium and high ranges should be lattice-matched to minimize or eliminate the chances of defects in them, because those subcells in the medium and high bandgap ranges will produce most (e.g., 90% or more) of the total power that is produced by the entire converter 10. Therefore, any significant defects in those medium and high bandgap subcells 12, 14, 16, etc. would have a significant adverse effect on total power production as well as solar to electrical energy conversion efficiency. Yet, a goal of this invention is to also extend the solar energy conversion capabilities of the MMT SPV converter 10 into the lower energy, infrared range to convert and add as much of the marginal energy available in that lower energy range as is practical to the total power output of the converter 10 and thereby to maximize solar to electrical energy conversion efficiency. Therefore, while the addition of the graded layer 22 and at least one LMM subcell 18 is important, if the graded layer 22 and/or lattice-mismatch should cause any defects, it is preferable to have them occur in the more marginal power producing, low bandgap range subcell(s) 18, 32, etc., than in the higher power producing, medium and high bandgap subcells 12, 14, 16, etc. Also, lattice-matching is thinner and takes less time to grow.

Another principle of this invention is that there should be nothing or as little as possible in front of a subcell that will block or prevent solar radiation that can be converted to electricity by that subcell from reaching that subcell. The terms "front" and "back" in relation to the converter 10 of this invention and component parts thereof refer to the direction the incident solar radiation propagates through the converter 10, i.e., from "front" to "back". Since a subcell 12, 14, 16, 18, etc. will absorb solar energy equal to and higher than the bandgap of the subcell and is transparent to solar energy lower than the bandgap, the highest bandgap subcell 12 has to be positioned in front of the others. The next highest bandgap subcell 14 has to be positioned next to the front subcell 12, and continuing in sequence from higher bandgap subcells to lower bandgap subcells until the lowest bandgap subcell is positioned at the back of the converter 10. Also, since the most beneficial designs and distributions of bandgaps for high efficiency solar to electrical energy conversion with the Group III-V semiconductor materials shown in FIG. 2 in view of the substrate materials available and the principles of this invention as described above, at least one, and preferably more than one, lattice-matched subcells have bandgaps that are higher than the substrate 20 materials. Further, since it is preferable for the lattice-matched subcells, i.e., those grown first on the substrate 20, to have the medium and high range bandgaps, while the lattice-mismatched subcells have bandgaps in the low range, for the reasons explained above, the parent substrate 20 has to be removed so that it does not absorb or block incident solar radiation before the incident solar radiation can reach the first subcell 12.

While this requirement to remove the parent substrates from the MMT SVP converter 10 could be considered a detriment, it actually leads to some significant benefits. For example, once the parent substrate 20 is removed, there remains a very effective and highly efficient, ultra-thin MMT SPV converter, which is flexible and can be mounted on a sheet-like flexible "handle" or on any other handle structure.

Actually, as a practical matter, the MMT SPV converter 10 is mounted first on a suitable handle, as will be explained below, and then the parent substrate 20 is removed, for example, by chemically etching it away. To prevent the etching process from damaging the rest of the converter 10 structure, an etch-stop layer 43 is deposited on the substrate 20 during fabrication of the MMT SPV converter 10, before the contact layer 34, the first LM subcell 12, and the rest of the components of the converter 10 are deposited. Therefore, the etch-stop layer 43 is already in use when it is time to remove the parent substrate 20 by etching it away. The etch-stop layer 43 can be made of a material such as GaInP in the case of a GaAs substrate, which is resistant to the etchant used to etch away the substrate 20.

Figure 3A:
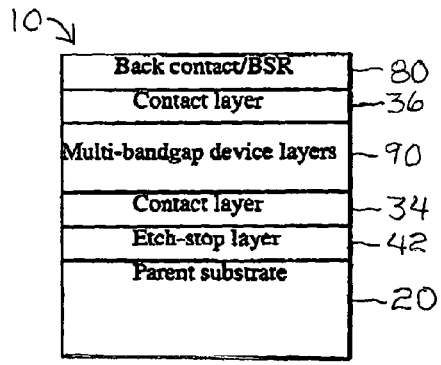
FIGS. 3a-d illustrate the steps in converting a monolithic, multi-bandgap, tandem solar photovoltaic converter of this invention into an ultra-thin device on a handle material according to this invention.
Figure 3B:
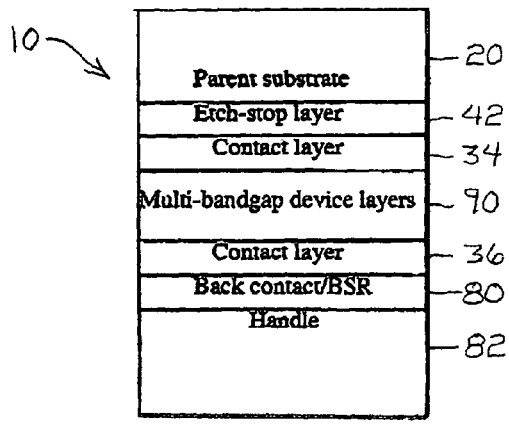

An example process of mounting the MMT SPV converter 10 of FIG. 1 onto a suitable handle and then removing the parent substrate 20 is illustrated in FIGS. 3a-d, although variations of this example or other processes can also be used. The etch-stop layer 43 and contact layers 34, 36 are numbered in FIGS. 3a-d the same as in FIG. 1, but, for simplicity, the other components numbered 12, 14, 16, 18, 22, 30, 32, 38, 40 in FIG. 1 are lumped together in component 90 in FIGS. 3a-d. In this example, a back electrical contact 80, such as electroplated gold, and, optionally, a back-surface reflector (BSR), such as gold on silicon dioxide, is applied to the back contact layer 36 of the MMT SPV converter 10, as shown in FIG. 3a, such as by evaporation. The converter 10 is then inverted and affixed to an appropriate handle 82, as shown in FIG. 3b, such as by an electrically conductive epoxy. The handle 82 can be a material that is chosen for any of a variety of advantageous characteristics and functions, for example, but not for limitation, strength, flexibility, economy, thermal conductivity, or selected electrical properties. Access to the back electrical contact 80 can be provided in any of a variety of ways, for example, but not for limitation, by metalizing the handle.

Figure 3C:
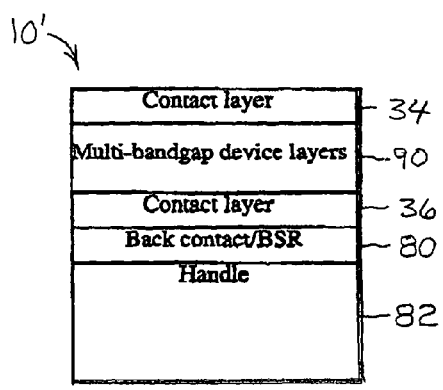

Then, with the MMT SPV converter 10 mounted on the handle 82, the parent substrate 20 is removed, for example, but not for limitation, by using a selective chemical etchant. The etch-stop layer 43 can also be removed, for example, but not for limitation, by similar selective etching. The result, as shown in FIG. 3c, is an ultra-thin, monolithic, multi-bandgap, tandem (MMT), solar photovoltaic (SPV) converter 10' on a handle 82. Since the MMT SPV converter 10' without the parent substrate 20 is very thin and flexible, it can be used as a flexible MMT SPV converter when the handle 82 is a flexible material such as would be required for storage on, and deployment from, a roll. Flexible means perceptibly deformable by hand without the use of tools.

Figure 3D:
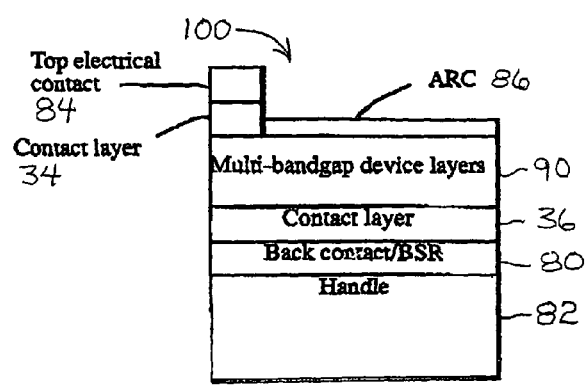

A top electrical contact material is applied on the front contact layer 34, both of which are then selectively removed to enable exposure of the first subcell 12 (FIG. 1) of the active device components 90 to incident solar radiation and leaving a grid contact layer 34 and top electrical contact 84, as shown in FIG. 3d. An anti-reflective coating (ACR) 86 can be applied to the exposed front surface of the first subcell 12 (FIG. 1) of the active device components 90 to reduce reflection and enhance absorption of solar radiation. Finally, the active device layers 90 can be mesa isolated by photolithographic and chemical etching techniques to eliminate electrical shunting. The finished device 100 is shown in FIG. 3d.

The ultra-thin MMT SPV converter 100 shown in FIG. 3d can provide a number of advantages. For example, these converters 100 have excellent thermal management capabilities, because the handle 82 can be a good thermally conductive material and because they can be heat sink bodies or can be placed in contact with heat sink bodies. Because the structure of the MMT SPV converters 10' without the parent substrate 20 are ultra-thin, heat generated in the MMT SPV structure is very close to the handle, thus readily removable, and the heat flow is essentially one-dimensional.

This ability to dissipate heat contrasts very favorably to devices on Ge or GaAs substrates, which have relatively poor thermal conductivity, and it makes the possibility of using these ultra-thin MMT SPV converters 100 in terrestrial concentrators and in space applications more attractive. For space applications, these handle-mounted, ultra-thin devices 100 can provide very high specific power (watts per kilogram), and the handles 82 can be strong, flexible, sheet materials such as metal foil or kapton. For terrestrial concentrators, in which solar energy is highly concentrated, the thermal management and heat dissipation capabilities are very beneficial. Also, since the handles 82 can be much more robust and stronger than the relatively fragile parent substrates 20, such as Ge or GaAs, the ultra-thin MMT SVP converters 100 can be more durable and useful in more rugged conditions. Another advantage is that by removing the parent substrates 20, the rather scarce and expensive elements that are used to make the parent substrate, such as Ga in GaAs, can be reclaimed and used again.

The ultra-thin MMT SPV converter devices 10' are particularly amenable to monolithic, integrated module (MIM) fabrication on insulated handles 82. An example ultra-thin MIM device 100' is illustrated diagrammatically in FIG. 4. It can be constructed by first growing a single MMT SPV converter 10, as described above and shown generically in FIG. 1, comprising, for example, two LM subcells 12, 14 and one LMM subcell 18 grown on a single parent substrate 20 (not shown in FIG. 4). In this example MIM device 100', the subcells are electrically isolated by transparent isolation layers 38', 42' to accommodate voltage matching, although tunnel junctions for series operation could be used. The transparent compositionally graded layer 22 is positioned between the isolation layers 42' and the LMM subcell 18.

Then the single MMT SPV converter 10 is inverted and mounted on a handle 82, as described above and shown in FIG. 3b. In this case, it is preferable that the handle 82 is an electrical insulator material. Then, the parent substrate 20 is removed, as shown in FIG. 3c and described above, leaving the ultra-thin MMT SVP converter 10' mounted on the handle 82.

Figure 4:
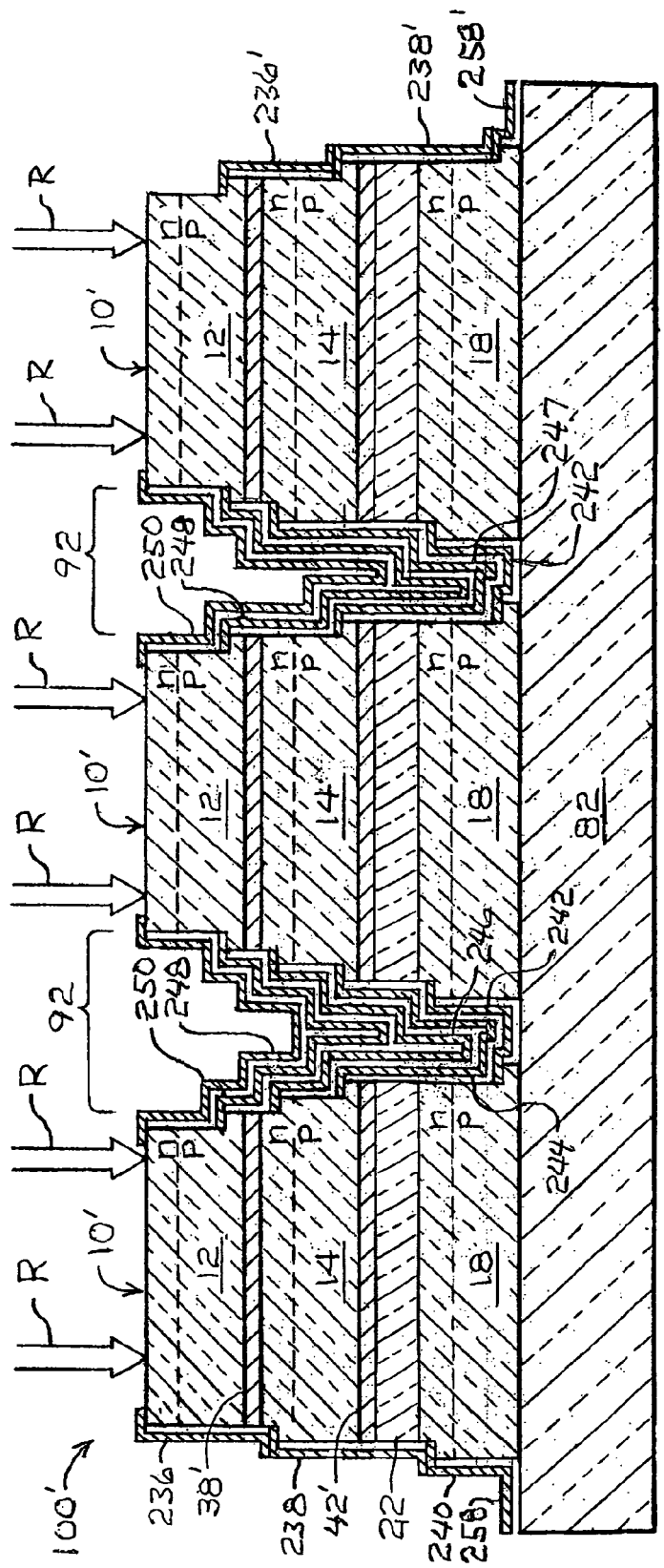
FIG. 4 is a diagrammatic, cross-section view of an example MIM structure that utilizes a monolithic, multi-bandgap, tandem solar photovoltaic converter of this invention.

To this point, the fabrication of the MIM device 100' is about the same as described above for the ultra-thin, handle-mounted, MMT Spy converter 10' in FIGS. 3a-d. However, the single, ultra-thin, MMT SPV converter 10' is then separated into a plurality of individual, smaller ultra-thin, MMT SPV converters 10" by etching away or otherwise removing material to form isolation trenches 92 between segments of the converters 10", as illustrated in FIG. 4. Finally, various conductors 236, 238, 240, 242, 244, 246, 248, 250, and others are added in various electrical connection patterns to interconnect the subcells 12, 14, 18 of the plurality of converter segments 10" to extract electric power from the converter segments 10". The spaces between the various conductors are filed with electrical insulation material, such as silicon nitride or any of a variety of other electrically insulating materials, to prevent short circuits between the conductors 94.

In the example, ultra-thin MIM device 100' in FIG. 4, the individual subcells are connected electrically in a combination of series and parallel electric subcircuits to voltage-match the subcell electrical outputs into one circuit with a positive terminal 258 and a negative terminal 258' for convenient electrical connection of the plurality of subcells in the device 100' to an external load.

Figure 5:
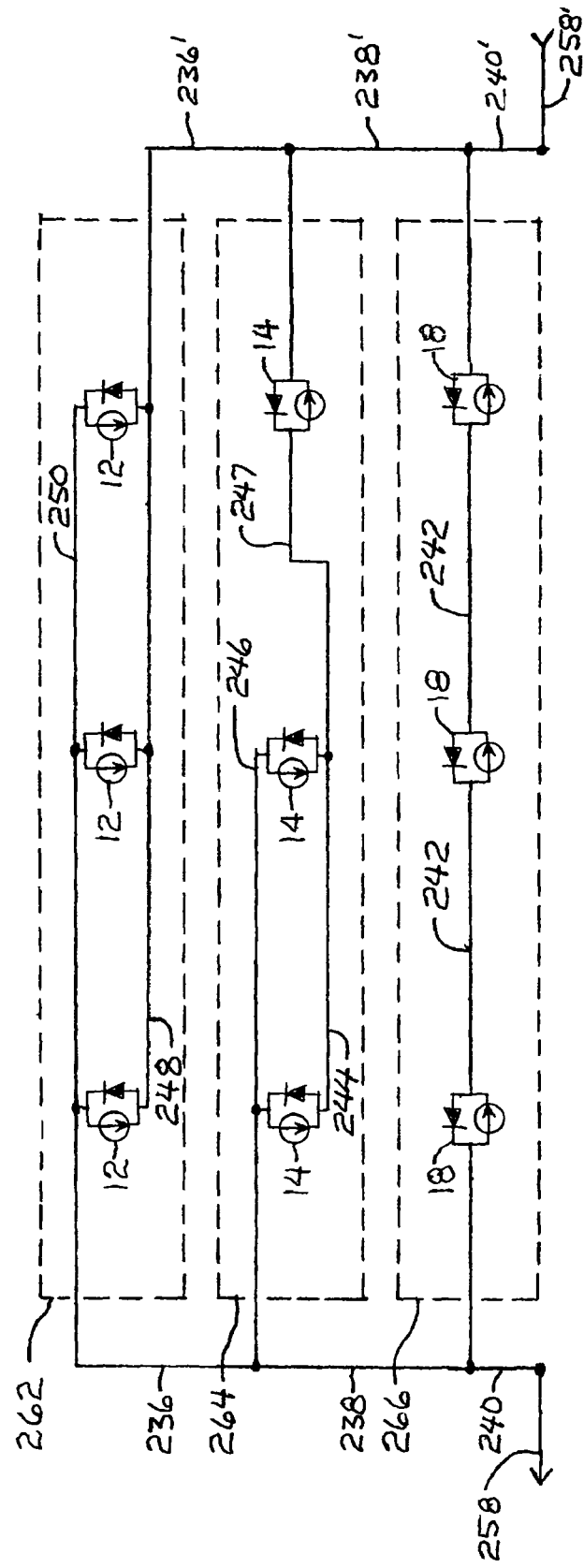
FIG. 5 is a schematic electric circuit diagram of the example MIM device of FIG. 4.

A schematic diagram of an equivalent electrical circuit corresponding to the example voltage-matched subcell circuits 262, 264, 266 of the MIM 100' of FIG. 4 is shown in FIG. 5. In general, a circuit comprising a plurality of subcells connected in parallel will have an output voltage that is some equilibration of the individual subcell output voltages, but current from the parallel connected subcells add. Conversely, a circuit comprising a plurality of subcells connected in series will have a current output equal to the subcell output current of the lowest current subcell in the series, but the output voltages of the series connected subcells add. Therefore, connecting a plurality of higher voltage subcells together in parallel can build current as output voltage remains somewhat equilibrated, while connecting a plurality of lower voltage sub cells together in series can boost the voltage output of the subcell circuit. Also, higher bandgap subcells produce higher voltage than lower bandgap subcells. Therefore, the subcells 192, 194, 196 of the stacks 10" can be connected in myriad combinations of series and/or parallel electrical connections, as illustrated in FIGS. 4 and 5, to create voltage-matched subcell circuits 262, 264, 266. Such electrical connection options are facilitated by the isolation layers 38', 42' and by the highly-resistive handle 82, as described above. Additional options can be provided by tunnel junctions instead of isolation layers 38', 42' or even by making handle 82 conductive rather than resistive for intra-subcell stack series connections, as explained above.

To illustrate several series and parallel connection options, the MIM converter device 100' in FIGS. 4 and 5 is shown, for example, with all of its highest bandgap, thus highest voltage, subcells 12 connected together in parallel to form the subcell circuit 262. The next highest bandgap, thus next highest voltage, subcells 14 are connected together in a combination of parallel 244, 246 and series 247 connections to form a subcell circuit 264 that is voltage-matched to the subcell circuit 262. The subcells 18, which are the lowest bandgap, thus lowest voltage, of the subcells on the handle 82, are shown in this example illustration of FIGS. 4 and 5 as all being connected in series in a subcell circuit 266 by conductors 242 in order to add their voltages in order to match the output voltage of subcell circuit 266 to the output voltages of the subcell circuits 262, 264. These parallel and series-connected subcell circuits 262, 264, 266 are connected in parallel to each other at conductors 236, 238, 240 and at 236', 238', 240' to add their respective current outputs.

As mentioned above, the MMT SVP converter 10 depicted in FIG. 1 is to provide a generic illustration of the invention, but it does not show or describe all possible variations. The lattice-matched (LM), double heterostructure (DH) subcells are grown with, in the case of serially connected subcells 12, 14, 16, 18, etc., intervening tunnel junctions, e.g., the tunnel junctions 38, 40, 42, etc. These tunnel junctions also have to be transparent to the solar radiation that is not absorbed by the immediately preceding subcell. Persons skilled in the art know how to fabricate appropriate tunnel junctions, so detailed descriptions are not necessary to the understanding of this invention. Suffice it to say that tunnel junctions are usually heavily doped and have polarity opposite that of the subcells. Therefore, if the subcells are doped, for example, to have n/p junctions, the tunnel junctions are usually heavily doped as $p^+/n^+$. Conversely, if the subcells are doped to have p/n junctions, the tunnel junctions are usually heavily doped as $n^+/p^+$.

Likewise, persons skilled in the art know how to formulate and fabricate double heterostructure (DH) subcells with materials such as those shown in the examples in Tables I-V, wherein the subcell absorber materials are listed for each example. "LM" means it is lattice-matched to the parent substrate, and "LMM" means it is lattice-mismatched. As mentioned above, each of the subcells 12, 14, 16, 18, etc. has a n/p or a p/n junction, either homojunction or heterojunction, and persons skilled in the art know how to dope the Group III-V alloys used in this invention and shown in the examples in Tables I-V to form such junctions. The passivation/carrier-confinement (PCC) material used to form the double heterostructure (DH) for each example subcell is also shown in Tables I-V. The general alloy of $Al_zGa_xIn_{1-x-z}As_yP_{1-y}$, is indicated for all the PCC layers, although, in practice, simpler alloys, for example, GaInP, could be used. It is impractical to list each possible configuration, but persons skilled in the art know how to formulate and fabricate DH subcell structures.

Epitaxial growth of the Group III-V semiconductor layers can be performed by any conventional process, including, but not limited to metalorganic vapor-phase epitaxy (MOVPE) or molecular beam epitaxy (MBE).

For a general view of what monolithic, multi-bandgap, tandem converters with electrically series connected subcell junctions, double heterostructures, and tunnel junctions look like, reference can be made to co-pending U.S. patent application, Ser. No. 10/515,243, which is incorporated herein by reference. For structures designed for voltage-matched or independently connected subcells 12, 14, 16 and/or 18, etc., the tunnel junctions 38, 40, 42, etc. shown in FIG. 1 would be replaced by electrical isolation layers, which are also well-known to persons skilled in the art and explained in co-pending U.S. patent application, Ser. No. 10/515,243, and in U.S. patent application, Ser. No. 10/275,123, entitled "Voltage-Matched, Monolithic, Multi-Bandgap Devices," which is incorporated herein by reference. The bandgaps indicated for the example subcells in Table I-V are approximate (+/−0.2 eV) and are chosen assuming series-connected subcells. However, similar structures and materials can also be used for voltage-matched, monolithic tandems. For example, instead of doping with $n^+$ and $p^+$ polarities for tunnel junctions, the materials can be doped with a deep acceptor element, such as Fe or Cr, to make high resistivity, isolation layers. Also, isolation diodes, in which one or more doped junctions, such as n-p junctions or n-p-n junctions with high enough reverse-bias breakdown characteristics to prevent current flow between subcells could be used for isolation layers. Again, these and other techniques for formulating and fabricating isolation layers between subcells are well-known to persons skilled in the art.

In the diagrammatic, generic representation of a MMT SPV converter 10 in FIG. 1, the LM subcells are numbered according to the index m, with the subcell bandgap decreasing, or remaining constant, as m increases. The inverted structure allows all of the LM subcells 12, 14, 16, etc. to be grown first, as described above, to avoid production of crystalline defects in the higher bandgap subcells. A transparent compositionally graded layer 22 is then grown to effect a change in lattice constant to match that of the low-bandgap GaInAs or other alloy(s) used for the back subcell(s) 18, etc., such as an alloy with a bandgap of about 1.0 eV to convert at least some infrared radiation to electricity. My experience with compositional grading indicates that incremental or step grading yields superior results to continuous grading. Typical grading parameters and procedures for precisely matching the top of the graded layer 22 to the GaInAs absorber layer or subcell 18 are described in PCT patent application no. WO 2004/022820, "Method for Achieving Device-Quality, Lattice-Mismatched, Heteroepitaxial Active Layers," which is incorporated herein by reference. The transparent graded layer is generally AlGaInAsP, although simpler sub-alloys, such as GaInP, are usually used in practice. Al-free materials for the graded layer(s) 22, etc. are generally preferred, because Al efficiently getters trace oxygen and water vapor in the crystal growth system, resulting in crystalline defects in the epilayers, which degrade device performance. As discussed above, a transparent tunnel junction 42 (or a transparent isolation layer, as discussed above) is placed somewhere between the last LM DH subcell 16 and the first LMM DH subcell 18. The LMM DH subcell 18 is then grown along with a final contact layer 36 to facilitate processing. As mentioned above, and as shown in Table V, a plurality of LMM DH subcells and corresponding graded layers and tunnel junctions 18, 22, 32, 42 can be included in the MMT SPV converter 10. A back-surface reflector (BSR) (not shown in FIG. 1) can also be added at the top, i.e., back, surface of the converter 10. Such a BSR can serve dual roles as both a sub-bandgap infrared (IR) heat reflector for improved thermal management and as a reflector that allows the LMM subcell 18 to be grown half the usual thickness and still achieve the usual overall IR absorption. Such a thinner LMM subcell 18 takes less time to grow and should produce about 20 mV more output voltage due to the "narrow diode" effect, i.e., about half the reverse-saturation current is produced. The completed MMT SPV converter 10 is processed into a completed ultra-thin MMT SPV converter 100 on a handle 83 (FIGS. 3a-b) as described above.

EXAMPLES

A series-connected, three-subcell device was grown on a GaAs substrate. LM n-GaInP{1 μm} etch-stop and n-GaAs (0.4 μm) contact layers were grown first. A LM DH top subcell comprising an n-AlInP (25 nm) front-surface confinement layer (FSCL), n-GaInP (0.1 μm, ordered) emitter layer, p-GaInP (1.2 μm, ordered) base layer, and a p-GaInP (0.1 μm, disordered) back-surface confinement layer (BSCL) was then deposited, followed by a $p^+/n^+$ $^{GaAs\ tunnel\ junction}$ (24 nm total thickness). The LM middle subcell comprises a n-GaInP (0.1 μm) emitter layer, a p-GaAs (2.5 μm) base layer, and a p-GaInP (50 nm, ordered) BSCL, followed by another $p^+/n^+$ GaAs tunnel junction (24 nm total thickness). A transparent, compositionally step-graded GaInP layer was then grown to affect a change in lattice constant to match that of the low bandgap (~1 eV) GaInAs alloy (Ga mole fraction of 0.75, LMM ~2.2%). The step grade included nine compositional steps with a Ga mole fraction increment of 0.03 per step, and a step thickness of 0.25 μm. The grade terminated with a Ga mole fraction of 0.24 in the GaInP buffer layer (1 μm) to compensate for residual compressive strain (a Ga mole fraction of 0.26 in the GaInP buffer layer would be LM to the 1-eV GaInAs if both layers were fully relaxed). The LMM, 1-eV, DH subcell (n-GaInP FSCL (50 nm), n-GaInAs emitter layer (150 nm), p-GaInAs base layer (2.9 μm), and P-GaInP BSCL (50 nm)) were then grown, along with a final $p^{30}$ -GaInAs (0.1 μm) contact layer to facilitate processing.

The processing sequence for inverted tandem cell structure involved a first step of preparing the top surface of the epistructure, which is actually the back surface of the device, by applying a back electrical contact, and, optionally, a back-surface reflector (BSR). The structure was then inverted and affixed to a pre-metalized "handle" material (in this case, conductive epoxy was used on an Al-coated Si wafer), which can be chosen to have a variety of advantageous properties and functions (e.g., strength, flexibility, low cost, good thermal conductivity, selected electrical properties, etc.). The resultant handle-mounted device has enhanced mechanical properties and access to the back electrical contact is established by keeping a portion of the metalized handle exposed. The third step involved removal of the parent substrate and associated etch-stop layer (accomplished here using selective wet-chemical etchants). In the final step, the top surface of the device had an electrical contact applied (grided, electroplated Au), and an antireflection coating (ARC) was also deposited. Additionally, the GaAs contact layer was selectively removed between the grids, and the active device layers were mesa isolated by wet-chemical etching to define the device area and to eliminate electrical shunting. The ultra-thin tandem device was then complete and ready for operation.

Semi-realistic modeling calculations were performed based on a rigorous approach for series-connected tandem subcells to serve as a guide for the choice of the bottom subcell bandgap and to predict potential performance under operating conditions relevant to ultra-high performance devices. We assumed that the bottom subcell quantum efficiency was 0.95 (spectrally independent) in all of the calculations. Also, the top and middle subcells were fixed to be GaInP (1.87 eV) and GaAs (1.42 eV), respectively. The results for the AM0 spectrum, at 25° C., and under one-sun intensity showed that the optimum bottom subcell bandgap was 1.02 eV, with a tandem efficiency of 33.1%. For terrestrial concentrator applications, we modeled for the low-AOD Direct spectrum, 250 suns, at 25° C., and obtained an optimum bottom subcell badngap of 1.01 eV, with a tandem efficiency of 41.5%.

Figure 6:
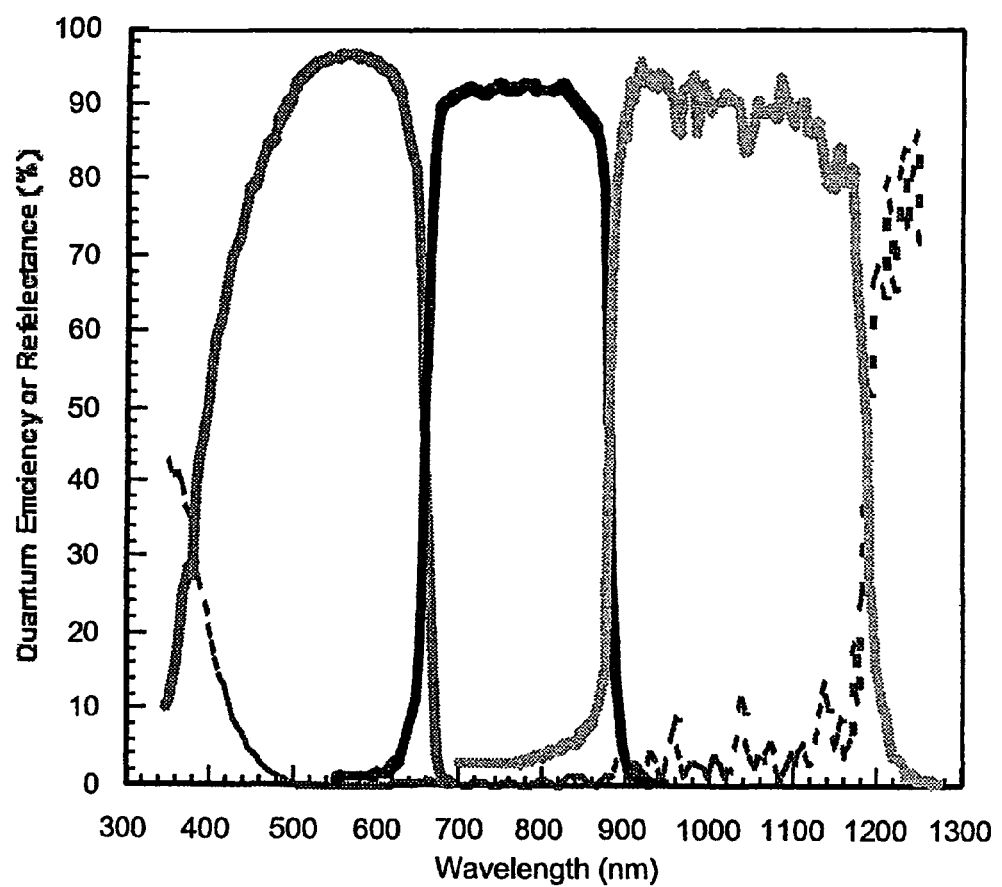
FIG. 6 is a graphical representation of the composite spectral absolute quantum efficiency (solid lines) and spectral reflectance (dotted line) data for an ultra-thin, handle-mounted, GaInP/GaAs/GaInAs series-connected tandem solar cell.

In a preliminary effort, we have been successful in growing, processing, and testing monolithic, series-connected, handle-mounted, ultra-thin GaInP/GaAs/GaInAs tandem solar cells. Quantum efficiency (QE) and reflectance (R) data are given in FIG. 6. The data generally show excellent carrier collection across a broad spectral range for all of the subcells. The R data, however, show that photocurrent gains are still possible at the far edges of the tandem response range. Improving the two-layer ZnS/MgF2 ARC will be a focus of future work. Interference effects are also observed in the QE data for the 1.02 eV bottom subcell, which occur because the sub cell is optically thin with a BSR, causing it to behave like a Fabry-Perot cavity. The interference effects are also evident in the R data over the response range of the bottom subcell. It is important to note that the QE for the bottom subcell is excellent despite its 2.2% LMM with respect to the GaAs substrate.

Figure 7:
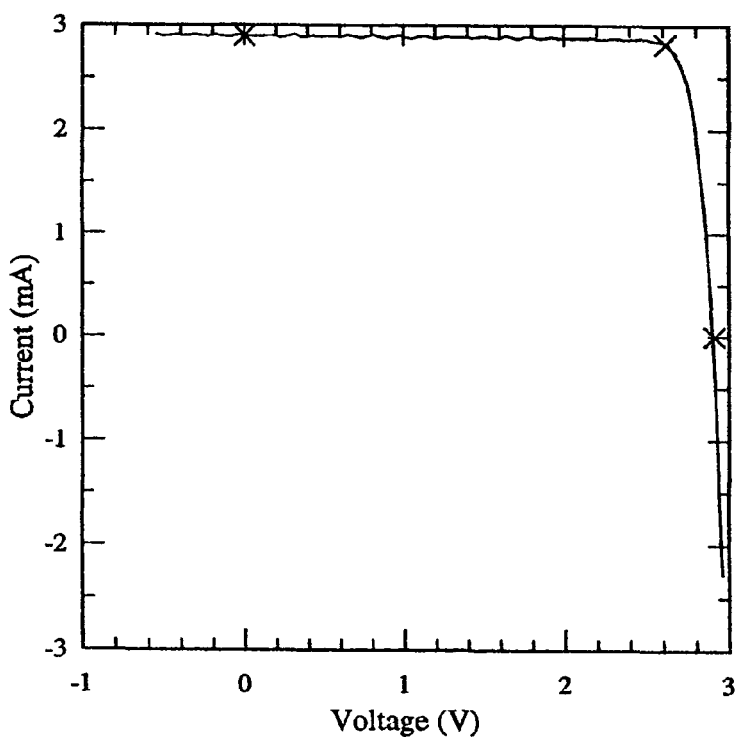
FIG. 7 is a graphical representation of the current-voltage data for a high-efficiency, ultra-thin, handle-mounted GaInP/GaAs/GaInAs series-connected, tandem solar cell measured under one-sun Global spectrum at 25° C.

Current-voltage data for the most efficient GaInP/GaAs/GaInAs tandem solar cell fabricated to date are shown in FIG. 7. The tandem cell is 31.1% efficient under the one-sun Global spectrum at 25° C., which is only ~1% absolute lower than the highest efficiency ever demonstrated for a solar cell under these conditions. With continued development, I anticipate that these devices will be 34-35% efficient under the above conditions.

Figure 8:
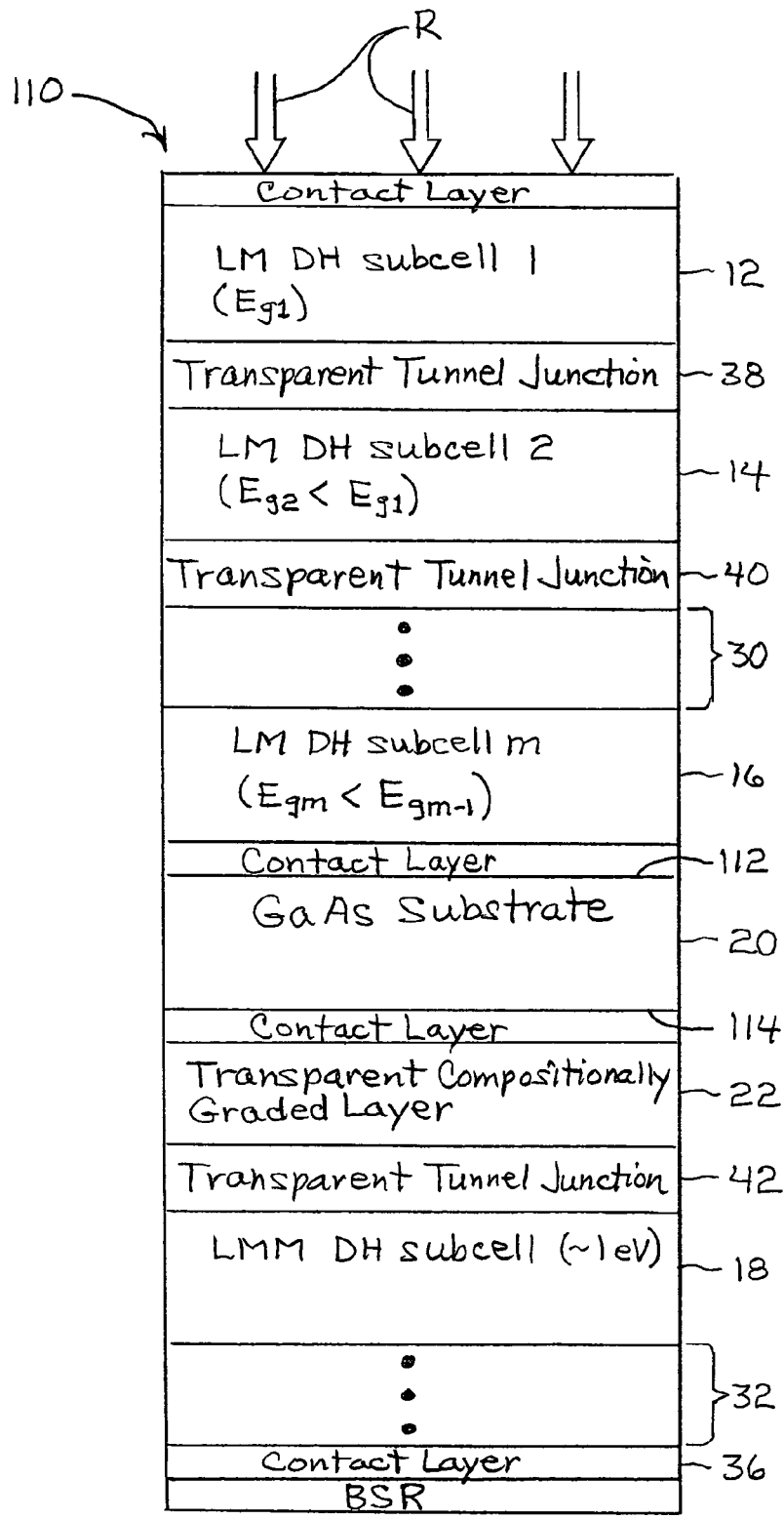
FIG. 8 is a diagrammatic view of a bifacial, monolithic, multi-bandgap, tandem solar photovoltaic converter of this invention.

Bifacially grown tandem structures, such as the example bifacial MMT SPV converter 110 shown in FIG. 8, can also be fabricated using the same materials as those listed in Tables I-V. In such bifacial structures it is preferred, but not essential, to grow the LM subcells 12, 14, 16 etc. on one face 112 of the substrate 20 and to grow the LMM subcells 18, etc. on the opposite face 114 of the substrate 20. In this arrangement, the LM subcells 12, 14, 16, etc. are not inverted, because the solar radiation R does not enter the converter 110 through the substrate 20, but is instead initially incident on the first LM cell 12. Therefore, except for the position of the substrate 20 between the LM subcells and the LMM subcell, the components are in the same order and are numbered the same as those in the converter 10 in FIG. 1. Graded layer 20 is grown on the substrate 20 to transition from the lattice constant of the substrate 20 to the lattice constant of the LMM subcell 18.

An advantage of this arrangement is that the LM and the LMM materials are separated by the substrate, which may prohibit dislocations in the LMM materials from looping back into the LM materials, thus protecting and preserving the high quality of the LM materials. A disadvantage of this arrangement is that the substrate 20 has to stay embedded in the structure and is not removable. Also, the substrate 20 must be transparent to photons exiting the LM materials stack. Therefore, Ge substrates cannot be used for this kind of bifacial configuration, because the 0.66 eV bandgap of Ge is smaller than the lowest bandgap LM subcell, which is typically GaAs.

In all of the serially connected converter embodiments described above, subcell photocurrent division is useful for reducing the required bandgap differential between subcells and thereby allows a larger number of bandgaps to be used in these MMT SPV converter devices. The subcell photocurrent division technique is based on the concept of creating two or more subcells with the same bandgap, each generating the same photocurrent. This technique is useful because it reduces the required bandgap differential between subcells, which allows a larger number of bandgaps to be used in the tandem device, resulting in higher conversion efficiency. This result is accomplished by adjusting the thicknesses of the respective subcells to control the amount of light absorbed by each. Perforating the subcells can produce the same effect. The ability to use more subcells with a larger number of bandgaps results in higher conversion efficiency.

Since these and numerous other modifications and combinations of the above-described method and embodiments will readily occur to those skilled in the art, it is not desired to limit the invention to the exact construction and process shown and described above. Accordingly, resort may be made to all suitable modifications and equivalents that fall within the scope of the invention as defined by the claims which follow. The words "comprise," "comprises," "comprising," "have," "having," "include," "including," and "includes" when used in this specification and in the following claims are intended to specify the presence of stated features or steps, but they do not preclude the presence or addition of one or more other features, steps, or groups thereof.

The invention and several embodiments in which an exclusive property or privilege is claimed is defined as follows:

1. A monolithic, multi-bandgap, tandem solar photovoltaic converter, comprising:
    at least one subcell grown lattice-matched in relation to a substrate with a bandgap at least as high as a medium energy range; and
    at least one subcell grown lattice-mismatched in relation to the substrate with a bandgap in a low energy range such that at least a portion of the at least one subcell with the bandgap in a low energy range is grown over the at least one subcell with the bandgap at least as high as a medium energy range.

2. The monolithic, multi-bandgap, tandem solar photovoltaic converter of claim 1, including:
    at least one subcell grown lattice-matched in relation to the substrate with a bandgap in the medium energy range; and
    at least one subcell grown lattice-matched in relation to the substrate with a bandgap in the high energy range.

3. The monolithic, multi-bandgap, tandem solar photovoltaic converter of claim 1, including a compositionally graded layer between said subcell with the bandgap at least as high as the medium range and said subcell with the bandgap in the low energy range, said graded layer having a bandgap that is at least as high as said subcell that has the bandgap at least as high as the medium range.

4. The monolithic, multi-bandgap, tandem solar photovoltaic converter of claim 1, wherein the substrate comprises GaAs.

5. The monolithic, multi-bandgap, tandem solar photovoltaic converter of claim 1, wherein the substrate comprises Ge.

6. The monolithic, multi-bandgap, tandem solar photovoltaic converter of claim 5, wherein the substrate comprises SiGe.

7. The monolithic, multi-bandgap, tandem solar photovoltaic converter of claim 4, wherein the substrate comprises GaAs bonded onto Si.

8. The monolithic, multi-bandgap, tandem solar photovoltaic converter of claim 1, wherein the substrate is a compliant substrate.

9. The monolithic, multi-bandgap, tandem solar photovoltaic converter of claim 1, wherein the substrate is positioned between said at least one lattice-matched subcell and said at least one lattice-matched subcell.

10. The monolithic, multi-bandgap, tandem solar photovoltaic converter of claim 9, including a graded layer positioned between the substrate and said at least one lattice-mismatched layer.

11. The monolithic, multi-bandgap, tandem solar photovoltaic converter of claim 10, wherein the substrate has a first lattice constant and said at least one lattice-mismatched subcell has a second lattice constant, and wherein the graded layer is compositionally graded to start with a lattice constant that matches the first lattice constant and to end with a lattice constant that matches the second lattice constant.

12. The monolithic, multi-bandgap, tandem solar photovoltaic converter of claim 1, wherein the at least one lattice-matched subcell comprises $Ga_xIn_{1-x}As_yP_{1-y}$, and the at least one lattice-mismatched subcell comprises $Ga_xIn_{1-x}As$.

13. The monolithic, multi-bandgap, tandem solar photovoltaic converter of claim 12, wherein the at least one lattice-matched subcell has a bandgap of about 1.7 eV and the at least one lattice-mismatched subcell has a bandgap of about 1.1 eV.

14. The monolithic, multi-bandgap, tandem solar photovoltaic converter of claim 1, wherein the at least one lattice-matched subcell comprises $Al_zGa_{1-z}As$ and the at least one lattice-mismatched subcell comprises $Ga_xIn_{1-x}As$.

15. The monolithic, multi-bandgap, tandem solar photovoltaic converter of claim 14, wherein the at least one lattice-matched subcell has a bandgap of about 1.7 eV and the at least one lattice-mismatched subcell has a bandgap of about 1.1 eV.

16. The monolithic, multi-bandgap, tandem solar photovoltaic converter of claim 1, wherein the at least one lattice-matched subcell comprises $Ga_xIn_{1-x}P$ and the at least one lattice-mismatched subcell comprises $Ga_xIn_{1-x}As$.

17. The monolithic, multi-bandgap, tandem solar photovoltaic converter of claim 16, wherein the at least one lattice-matched subcell has a bandgap of about 1.8 eV and the at least one lattice-mismatched subcell has a bandgap of about 1.2 eV.

18. The monolithic, multi-bandgap, tandem solar photovoltaic converter of claim 2, wherein the at least one lattice-matched subcell in the high energy range comprises (Al)$Ga_xIn_{1-x}P$, the at least one lattice-matched subcell in the medium energy range comprises (In)GaAs, and the at least one lattice-mismatched subcell comprises $Ga_xIn_{1-x}As$.

19. The monolithic, multi-bandgap, tandem solar photovoltaic converter of claim 18, wherein the at least one lattice-matched subcell in the high energy range has a bandgap of about 1.9 eV, the at least one lattice-matched subcell in the medium energy range has a bandgap of about 1.4 eV, and the at least one lattice-mismatched subcell has a bandgap of about 1.0 eV.

20. The monolithic, multi-bandgap, tandem solar photovoltaic converter of claim 2, wherein the at least one lattice-matched subcell in the high energy range comprises $Al_zGa_{1-z}As$, the at least one lattice-matched subcell in the medium energy range comprises (In)GaAs, and the at least one lattice-mismatched subcell comprises $Ga_xIn_{1-x}As$.

21. The monolithic, multi-bandgap, tandem solar photovoltaic converter of claim 20, wherein the at least one lattice-matched subcell in the high energy range has a bandgap of about 1.9 eV, the at least one lattice-matched subcell in the medium energy range has a bandgap of about 1.4 eV, and the at least one lattice-mismatched subcell has a bandgap of about 1.0 eV.

22. The monolithic, multi-bandgap, tandem solar photovoltaic converter of claim 2, including at least two lattice-matched subcells in the high energy range, at least one lattice-matched subcell in the medium energy range, at least one lattice-mismatched subcell in the low energy range.

23. The monolithic, multi-bandgap, tandem solar photovoltaic converter of claim 22, wherein at least one of the lattice-matched subcells in the high energy range comprises (Al)$Ga_xIn_{1-x}P$, at least another one of the lattice-matched subcells in the high energy range comprises (Al)$Ga_xIn_{1-x}As_yP_{1-y}$, the at least one lattice-matched subcell in the medium energy range comprises (In)GaAs, and the at least one lattice-mismatched subcell comprises $Ga_xIn_{1-x}As$.

24. The monolithic, multi-bandgap, tandem solar photovoltaic converter of claim 23, wherein said at least one of the lattice-matched subcells in the high energy range that comprises (Al)$Ga_xIn_{1-x}P$ has a bandgap of about 1.9 eV, said at least another one of the lattice-matched subcells in the high energy range that comprises (Al)$Ga_xIn_{1-x}As_yP_{1-y}$ has a bandgap of about 1.7 eV, said at least one lattice-matched subcell in the medium energy range that comprises (In)GaAs has a bandgap of about 1.4 eV, and said at least one lattice-mismatched subcell that comprises $Ga_xIn_{1-x}As$ has a bandgap of about 1.1 eV.

25. The monolithic, multi-bandgap, tandem solar photovoltaic converter of claim 22, wherein at least one of the lattice-matched subcells in the high energy range comprises (Al)$Ga_xIn_{1-x}P$, at least another one of the lattice-matched subcells in the high energy range comprises $Al_zGa_{1-z}As$, the at least one lattice-matched subcell in the medium energy range comprises (In)GaAs, and the at least one lattice-mismatched subcell comprises $Ga_xIn_{1-x}As$.

26. The monolithic, multi-bandgap, tandem solar photovoltaic converter of claim 25, wherein said at least one of the lattice-matched subcells in the high energy range that comprises (Al)$Ga_xIn_{1-x}P$ has a bandgap of about 1.9 eV, said at least another one of the lattice-matched subcells in the high energy range that comprises $Al_zGa_{1-x}As$ has a bandgap of about 1.7 eV, said at least one lattice-matched subcell in the medium energy range that comprises (In)GaAs has a bandgap of about 1.4 eV, and said at least one lattice-mismatched subcell that comprises $Ga_xIn_{1-x}As$ has a bandgap of about 1.1 eV.

27. The monolithic, multi-bandgap, tandem solar photovoltaic converter of claim 22, including at least three lattice-matched subcells in the high energy range, at least one lattice-matched subcell in the medium energy range, and at least one lattice-mismatched subcell in the low energy range.

28. The monolithic, multi-bandgap, tandem solar photovoltaic converter of claim 27, wherein at least two of the lattice-matched subcells in the high energy range have bandgaps that are the same as each other.

29. The monolithic, multi-bandgap, tandem solar photovoltaic converter of claim 28, wherein said at least two lattice-matched subcells in the high energy range that have the same bandgaps as each comprise $(Al)Ga_xIn_{1-x}P$, at least one of the lattice-matched subcells in the high energy range comprises $(Al)Ga_xIn_{1-x}As_yP_{1-y}$, the at least one lattice-matched subcell in the medium energy range comprises (In)GaAs, and the at least one lattice-mismatched subcell comprises $Ga_xIn_{1-x}As$.

30. The monolithic, multi-bandgap, tandem solar photovoltaic converter of claim 29, wherein said at least two lattice-matched subcells in the high energy range that have the same bandgaps and comprise $(Al)Ga_xIn_{1-x}P$ have bandgaps of about 1.9 eV, said at least one of the lattice-matched subcells in the high energy range that comprises $(Al)Ga_xIn_{1-x}As_yP_{1-y}$ has a bandgap of about 1.7 eV, the at least one lattice-matched subcell in the medium energy range that comprises (In)GaAs has a bandgap of about 1.4 eV, and the at least one lattice-mismatched subcell that comprises $Ga_xIn_{1-x}As$ has a bandgap of about 1.1 eV.

31. The monolithic, multi-bandgap, tandem solar photovoltaic converter of claim 28, wherein said at least two lattice-matched subcells in the high energy range that have the same bandgaps as each comprise $(Al)Ga_xIn_{1-x}P$, at least one of the lattice-matched subcells in the high energy range comprises $Al_zGa_{1-z}As$, the at least one lattice-matched subcell in the medium energy range comprises (In)GaAs, and the at least one lattice-mismatched subcell comprises $Ga_xIn_{1-x}As$.

32. The monolithic, multi-bandgap, tandem solar photovoltaic converter of claim 31, wherein said at least two lattice-matched subcells in the high energy range that have the same bandgaps and comprise $(Al)Ga_xIn_{1-x}P$ have bandgaps of about 1.9 eV, said at least one of the lattice-matched subcells in the high energy range that comprises $Al_zGa_{1-z}As$ has a bandgap of about 1.7 eV, the at least one lattice-matched subcell in the medium energy range that comprises (In)GaAs has a bandgap of about 1.4 eV, and the at least one lattice-mismatched subcell that comprises $Ga_xIn_{1-x}As$ has a bandgap of about 1.1 eV.

33. The monolithic, multi-bandgap, tandem solar photovoltaic converter of claim 27, including at least three lattice-matched subcells in the high energy range, at least one lattice-matched subcell in the medium energy range, and at least two lattice-mismatched subcells in the low energy range.

34. The monolithic, multi-bandgap, tandem solar photovoltaic converter of claim 33, wherein at least two of the lattice-matched subcells in the high energy range have bandgaps that are the same as each other.

35. The monolithic, multi-bandgap, tandem solar photovoltaic converter of claim 28, wherein said at least two lattice-matched subcells in the high energy range that have the same bandgaps as each comprise $(Al)Ga_xIn_{1-x}P$, at least one of the lattice-matched subcells in the high energy range comprises $(Al)Ga_xIn_{1-x}As_yP_{1-y}$, the at least one lattice-matched subcell in the medium energy range comprises (In)GaAs, at said least two lattice-mismatched subcells in the low energy range comprise $Ga_xIn_{1-x}As$.

36. The monolithic, multi-bandgap, tandem solar photovoltaic converter of claim 35, wherein said at least two lattice-matched subcells in the high energy range that have the same bandgaps and comprise $(Al)Ga_xIn_{1-x}P$ have bandgaps of about 1.9 eV, said at least one of the lattice-matched subcells in the high energy range that comprises $(Al)Ga_xIn_{1-x}As_yP_{1-y}$ has a bandgap of about 1.7 eV, the at least one lattice-matched subcell in the medium energy range that comprises (In)GaAs has a bandgap of about 1.4 eV, at least one of the lattice-mismatched subcells that comprises $Ga_xIn_{1-x}As$ has a bandgap of about 1.1 eV, and at least one of the lattice-mismatched subcells that comprises $Ga_xIn_{1-x}As$ has a bandgap of about 0.9 eV.

37. The monolithic, multi-bandgap, tandem solar photovoltaic converter of claim 28, wherein said at least two lattice-matched subcells in the high energy range that have the same bandgaps as each comprise $(Al)Ga_xIn_{1-x}P$, at least one of the lattice-matched subcells in the high energy range comprises $Al_zGa_{1-z}As$, the at least one lattice-matched subcell in the medium energy range comprises (In)GaAs, and said at least two lattice-mismatched subcells comprise $Ga_xIn_{1-x}As$.

38. The monolithic, multi-bandgap, tandem solar photovoltaic converter of claim 31, wherein said at least two lattice-matched subcells in the high energy range that have the same bandgaps and comprise $(Al)Ga_xIn_{1-x}P$ have bandgaps of about 1.9 eV, said at least one of the lattice-matched subcells in the high energy range that comprises $Al_zGa_{1-z}As$ has a bandgap of about 1.7 eV, the at least one lattice-matched subcell in the medium energy range that comprises (In)GaAs has a bandgap of about 1.4 eV, at least one of the lattice-mismatched subcell that comprises $Ga_xIn_{1-x}As$ has a bandgap of about 1.1 eV, and at least one the lattice-mismatched subcell that comprises $Ga_xIn_{1-x}As$ has a bandgap of about 0.9 eV.

39. The monolithic, multi-bandgap, tandem solar photovoltaic converter of claim 1, wherein the at least one lattice-matched subcell has a bandgap of about 1.7 eV and the at least one lattice-mismatched subcell has a bandgap of about 1.1 eV.

40. The monolithic, multi-bandgap, tandem solar photovoltaic converter of claim 1, wherein the at least one lattice-matched subcell has a bandgap of about 1.8 eV and the at least one lattice-mismatched subcell has a bandgap of about 1.2 eV.

41. The monolithic, multi-bandgap, tandem solar photovoltaic converter of claim 2, wherein the at least one lattice-matched subcell in the high energy range has a bandgap of about 1.9 eV, the at least one lattice-matched subcell in the medium energy range has a bandgap of about 1.4 eV, and the at least one lattice-mismatched subcell has a bandgap of about 1.0 eV.

42. The monolithic, multi-bandgap, tandem solar photovoltaic converter of claim 22, wherein said at least one of the lattice-matched subcells in the high energy range has a bandgap of about 1.9 eV, said at least another one of the lattice-matched subcells in the high energy range has a bandgap of about 1.7 eV, said at least one lattice-matched subcell in the medium energy range has a bandgap of about 1.4 eV, and said at least one lattice-mismatched subcell has a bandgap of about 1.1 eV.

43. The monolithic, multi-bandgap, tandem solar photovoltaic converter of claim 28, wherein said at least two lattice-matched subcells in the high energy range that have the same bandgaps have bandgaps of about 1.9 eV and at least one of the lattice-matched subcells in the high energy range has a bandgap of about 1.7 eV, the at least one lattice-matched subcell in the medium energy range has a bandgap of about 1.4 eV, and the at least one lattice-mismatched subcell has a bandgap of about 1.1 eV.

44. The monolithic, multi-bandgap, tandem solar photovoltaic converter of claim 34, wherein said at least two lattice-matched subcells in the high energy range that have the same bandgaps have bandgaps of about 1.9 eV and at least one of the lattice-matched subcells in the high energy range has a bandgap of about 1.7 eV, the at least one lattice-matched subcell in the medium energy range has a bandgap of about 1.4 eV, at least one of the lattice-mismatched subcells has a bandgap of about 1.1 eV, and at least one of the lattice-mismatched subcells has a bandgap of about 0.9 eV.

45. The monolithic, multi-bandgap, tandem solar photovoltaic converter of claim 3, including a tunnel junction positioned between said subcell with the bandgap at least as high as the medium range and said subcell with the bandgap in the low energy range, said tunnel junction having a bandgap that is at least as high as said subcell that has the bandgap at least as high as the medium range.

46. The monolithic, multi-bandgap, tandem solar photovoltaic converter of claim 45, wherein the tunnel junction is positioned between the subcell with the bandgap at least as high as the medium range and the graded layer.

47. The monolithic, multi-bandgap, tandem solar photovoltaic converter of claim 1, wherein the bandgap of said at least one subcell grown lattice-matched in relation to the substrate is at least as high as 1.2 eV.

48. The monolithic, multi-bandgap, tandem solar photovoltaic converter of claim 47, wherein the bandgap of said at least one subcell grown lattice-mismatched to the substrate is in a range of 0.8 to 2.2 eV.

49. The monolithic, multi-bandgap, tandem solar photovoltaic converter of claim 3, wherein the substrate is selected from a group consisting of GaAs, Ge, SiGe, and GaAs bonded onto Si.

50. The monolithic, multi-bandgap, tandem solar photovoltaic converter of claim 49, wherein the substrate has a first lattice constant and said at least one lattice mismatched subcell has a second lattice constant, and wherein the graded layer is compositionally graded to start with a lattice constant that matches the first lattice constant and to end with a lattice constant that matches the second lattice constant.

51. The monolithic, multi-bandgap, tandem solar photovoltaic converter of claim 50, wherein the at least one lattice-matched subcell comprises $Ga_xIn_{1-x}As_yP_{1-y}$ and the at least one lattice-mismatched subcell comprises $Ga_xIn_{1-x}As$.

52. The monolithic, multi-bandgap, tandem solar photovoltaic converter of claim 51, wherein the at least one lattice-matched subcell has a bandgap of about 1.7 eV and the at least one lattice-mismatched subcell has a bandgap of about 1.1.

53. The monolithic, multi-bandgap, tandem solar photovoltaic converter of claim 50, wherein the at least one lattice-matched subcell comprises $Ga_xIn_{1-x}P$ and the at least one lattice-mismatched subcell comprises $Ga_xIn_{1-x}As$.

54. The monolithic, multi-bandgap, tandem solar photovoltaic converter of claim 53, wherein the at least one lattice-matched subcell has a bandgap of about 1.8 eV and the at least one lattice-mismatched subcell has a bandgap of about 1.2 eV.

55. The monolithic, multi-bandgap, tandem solar photovoltaic converter of claim 3, wherein the substrate has a first lattice constant and said at least one lattice mismatched subcell has a second lattice constant, and wherein the graded layer is compositionally graded to start with a lattice constant that matches the first lattice constant and to end with a lattice constant that matches the second lattice constant.

56. The monolithic, multi-bandgap, tandem solar photovoltaic converter of claim 55, wherein the at least one lattice-matched subcell comprises $Ga_xIn_{1-x}As_yP_{1-y}$ and the at least one lattice-mismatched subcell comprises $Ga_xIn_{1-x}As$.

57. The monolithic, multi-bandgap, tandem solar photovoltaic converter of claim 56, wherein the at least one lattice-matched subcell has a bandgap of about 1.7 eV and the at least one lattice-mismatched subcell has a bandgap of about 1.1.

58. The monolithic, multi-bandgap, tandem solar photovoltaic converter of claim 57, wherein the at least one lattice-matched subcell comprises $Ga_xIn_{1-x}P$ and the at least one lattice-mismatched subcell comprises $Ga_xIn_{1-x}As$.

59. The monolithic, multi-bandgap, tandem solar photovoltaic converter of claim 58, wherein the at least one lattice-matched subcell has a bandgap of about 1.8 eV and the at least one lattice-mismatched subcell has a bandgap of about 1.2 eV.

* * * * *